(12) United States Patent
Takahashi

(10) Patent No.: US 6,610,989 B1
(45) Date of Patent: Aug. 26, 2003

(54) PROXIMITY EFFECT CORRECTION METHOD FOR CHARGED PARTICLE BEAM EXPOSURE

(75) Inventor: Kimitoshi Takahashi, Sunnyvale, CA (US)

(73) Assignee: Fujitsu Limited, Kawasaki (JP)

( * ) Notice: Subject to any disclaimer, the term of this patent is extended or adjusted under 35 U.S.C. 154(b) by 397 days.

(21) Appl. No.: 09/583,880

(22) Filed: May 31, 2000

(30) Foreign Application Priority Data

May 31, 1999 (JP) .......................................... 11-151330

(51) Int. Cl.[7] .......................... G21G 5/00; H01J 37/08; G21K 5/10; G03F 9/00; G03C 5/00
(52) U.S. Cl. ................................ 250/492.3; 250/492.1; 250/492.2; 250/492.21; 250/492.22; 250/492.23; 430/5; 430/296; 430/302; 430/311; 430/942
(58) Field of Search .......................... 250/492.3, 492.2, 250/492.22, 492.23, 492.1; 430/30, 296, 942, 5, 302, 311

(56) References Cited

U.S. PATENT DOCUMENTS

| 4,698,509 A | * | 10/1987 | Wells et al. ................. 250/398 |
| 5,051,598 A | | 9/1991 | Ashton et al. |
| 5,260,579 A | * | 11/1993 | Yasuda et al. ............... 250/398 |
| 5,278,419 A | | 1/1994 | Takahashi et al. |
| 5,700,604 A | * | 12/1997 | Okino .......................... 430/296 |
| 5,841,145 A | * | 11/1998 | Satoh et al. ............ 250/492.22 |
| 6,153,340 A | * | 11/2000 | Nakasuji ...................... 430/296 |
| 6,200,710 B1 | * | 3/2001 | Hada ............................ 430/30 |
| 6,277,542 B1 | * | 8/2001 | Okino et al. ................. 430/296 |
| 2002/0006563 A1 | * | 1/2002 | Kamijo ........................ 430/30 |
| 2002/0027198 A1 | * | 3/2002 | Nagata et al. ............... 250/307 |
| 2002/0036272 A1 | * | 3/2002 | Okino ...................... 250/491.1 |
| 2002/0036273 A1 | * | 3/2002 | Okino ...................... 250/491.1 |
| 2002/0116697 A1 | * | 8/2002 | Okamoto et al. ............. 716/21 |

FOREIGN PATENT DOCUMENTS

| JP | 05206016 A | * | 8/1993 | ......... H01L/21/027 |
| JP | 06053129 A | * | 2/1994 | ......... H01L/21/027 |
| JP | 8-31727 | | 2/1996 | |
| JP | 09063926 A | * | 3/1997 | ......... H01L/21/027 |
| JP | 11-26360 | | 1/1999 | |

OTHER PUBLICATIONS

Fast proximity effect correction method using a pattern area density map; Journal of Vacuum Science Technology, vol. B10, No. 6, pp. 3072–3076 (1992).

* cited by examiner

Primary Examiner—John R. Lee
Assistant Examiner—Bernard Souw
(74) Attorney, Agent, or Firm—Staas & Halsey LLP

(57) ABSTRACT

A design width is changed in such a way that the design width is equal to a half-width of an exposure intensity distribution obtained by estimating a surface integral of a forward-scattering term of a basic exposure intensity distribution function over a pattern of interest. Proximity effect correction is performed such that Qcp times a sum of a half of a peak intensity of a forward-scattering component and a backscattering component is equal to the threshold value Eth for development. An exposure intensity distribution due to the backscattering term is calculated using a pattern area density method. An exposure pattern arranging plane is partitioned into meshes each for an auxiliary exposure shot whose size is smaller than that of a block shot. Auxiliary exposure is performed on each mesh short of exposure intensity after a block shot is applied.

17 Claims, 24 Drawing Sheets

REFERENCE PATTERN

13

⊠ : EI1    EI1 > EI2 > EI3

▨ : EI2

☐ : EI3

⊠ : EI4    EI4 > EI5 > EI6 = 0

▨ : EI5

☐ : EI6

PROXIMITY EFFECT CORRECTION METHOD FOR CHARGED PARTICLE BEAM EXPOSURE

BACKGROUND OF THE INVENTION

1. Field of the Invention

The present invention relates to a proximity effect correction method for improving dimensional accuracy of a developed pattern in preparation of exposure data for a charged particle beam exposure system.

2. Description of the Related Art

When a charged particle beam, for example an electron beam, is irradiated on a resist film on a substrate to draw a circuit pattern, there occurs such a phenomenon called forward scattering that a part of electrons of an incident electron beam scatters in the resist film prior to entry into the substrate, and such a phenomenon called backward scattering that electrons of the incident electron beam transmit the resist film and collide with nuclei of the substrate to scatter and come into the resist film again. Hence, an electron beam irradiated to one point on a resist film extends its influence on adjacent portions, producing a so-called proximity effect.

A basic exposure intensity distribution function f(X, Y) under the condition that an electron beam is irradiated to a point on a resist film of X=0 and Y=0, is approximately expressed by a following equation including forward and backward scattering terms of Gaussian functions.

$$f(X, Y) = \frac{1}{\pi(1+\eta)} \left\{ \frac{1}{\beta_f^2} \exp\left(-\frac{X^2+Y^2}{\beta_f^2}\right) + \frac{\eta}{\beta_b^2} \exp\left(-\frac{X^2+Y^2}{\beta_b^2}\right) \right\} \quad (1)$$

where $\eta$ is a ratio of a backscattering energy to a forward-scattering energy (hereinafter simply referred to as a "back-scattering ratio"), $\beta_f$ is a forward-scattering radius and $\beta_b$ is a backscattering radius. Values of the parameters are dependent on energy of an electron beam, a thickness of a resist film arid a material of the substrate, and are determined experimentally. With an acceleration voltage of an electron beam is higher, $\beta_f$ is smaller while $\beta_b$ is larger.

In a prior art proximity effect correction method, an exposure dose was determined in such a way that evaluation points are set at middle points of edges or corners of a pattern to be exposed, an exposure intensity at each evaluation point is calculated with the equation (1), and an exposure dose distribution is determined in such a way that the square-sum of the differences between the exposure intensities and a target value is minimized.

However, in company with progress toward higher integration of Large Scale Integration (LSI), the number of figures of a pattern has rapidly increased, making a calculation time excessively long.

Therefore, such a proximity effect correction method has been desired that it is possible to reduce a calculation time and to limit a dimensional error of a developed pattern within an allowable range.

As one of such methods, for example, JP 2502418 and Journal of Vacuum Science Technology, Vol. B10, No. 6, pp. 3072–3076 disclose a method of approximately calculating backscattering exposure intensity at the mesh of interest, comprising the steps of partitioning a placement surface of an LSI pattern to be exposed into rectangular meshes, calculating pattern area densities in the respective meshes, and taking an influence coming from surroundings meshes to the mesh of interest into consideration based on the backscattering term of the equation (1). Using this method, an exposure dose is determined in such a way that a sum of a half of a peak value of a forward-scattering exposure intensity distribution and a backscattering exposure intensity is constant.

According to this method, dimensional variations in a developed pattern in a wide area, caused by an influence of backscattering, can be prevented with a simple algorithm.

However, this method has the following problems.

(1) Since the expanse of the deposited energy distribution due to forward scattering is not taken into consideration, there is no assurance that dimensions of a developed pattern coincide with those in design. That is, since with a pattern is finer, the expanse of the deposited energy distribution near a half of a peak value thereof is not negligible, a developed pattern is fatter than its design pattern.

(2) In a region where a pattern area density changes rapidly and a dimensional variation of a pattern within one shot becomes conspicuous, as,kin a peripheral region of a DRAM cell array, correction is insufficient.

In order to solve the problem (1), a Japanese Patent Application of Publication No. 11-26360 discloses a method that performs a proximity effect correction using a pattern area density after offsetting a dimension L of an exposure pattern by a predetermined value $\Delta L$. In this method, in order to improve a latitude, after a design pattern is previously applied with a dimensional offset of $\Delta L$, the equation of exposure intensity distribution is transformed into a form including the offset size when performing a proximity effect correction by means of a pattern area density method, whereby a change in pattern area density caused by the size offset is taken into consideration.

In this method, however, since there is disclosed no definite value $\Delta L$ of the size offset to be different depending on a pattern size but a general, technical concept is simply shown, therefore there is no guarantee that dimensions of a developed pattern coincide with those in design in an actual electron beam exposure.

In order to solve the problem (2), there is disclosed, in a Japanese Patent Application of Publication No. 8-31727, an invention in which one shot size (a size of pattern partitioning) is made smaller only in a region where a pattern area density changes rapidly and thereby, a dimensional accuracy is improved in such a region. For example, a stencil mask is employed, and each of block patterns is exposed with one shot in the middle region of a memory cell array where an influence of backscattering from its surroundings is almost constant, while a variable-shaped rectangular exposure of a small size is performed in the peripheral region of the memory cell array.

However, since the number of shots per a unit area in the peripheral region of the,memory cell array increases, a though put decreases. If block patterns of a small size are formed on the stencil mask in order to expose the peripheral region in blocks, the number of block patterns to be formed in a limited space on the mask increase, thereby increasing patterns that cannot be exposed in blocks to reduce a throughput.

A Japanese Patent No. 2,842737 discloses such a method that exposure in a region where a pattern area density changes rapidly is superimposed by an auxiliary shot whose focus is out (changed from the best so that beam profile is blurred, thereby improving dimensional accuracy of a developed pattern. In this method, an auxiliary exposure whose focus is out is applied to a peripheral region where an actual exposure intensity becomes short when in adoption of an exposure intensity calculated based on a pattern area density method in a middle portion of a device pattern, thereby making exposure intensity in the middle portion equal to that in the peripheral region.

However, since out-of-focus beam size is almost equal to a backscattering radius $\beta_b$, the out-of-focus amount increases as an acceleration voltage of an electron beam becomes higher and application of this method becomes hard. For example, if an acceleration voltage is 50 kV, then $\beta_f$=0.028 $\mu$m and $\beta_b$=11.43 $\mu$m. Further, since a mesh size in a pattern area density calculation is about a backscattering radius $\beta_b$ and correction is Effected in units of a mesh, with an acceleration voltage increases, dimensional accuracy of a developed pattern is degraded. In addition to this, since there is a need to change a beam focal point in large amount to get out of focus required while exposing, this is a cause for reducing throughput.

SUMMARY OF THE INVENTION

Accordingly, it is an object of the present invention to provide a charged particle beam exposure method using a proximity effect correction method by which dimensional accuracy of a developed pattern is improved without a great increase in calculation times It is another object of the present invention to provide a charged particle beam exposure method using a proximity effect correction method by which the number of shots per a unit area can be decreased with simple data processing without reducing dimensional accuracy of a developed pattern in a region where effective pattern area densities change rapidly.

According to the first aspect of the present invention, there is provided a charged particle beam exposure method with performing proximity effect correction comprising: a self-correction step of adjusting a design width in such a way that a peak width, which is a width of an exposure intensity distribution at a height of a predetermined percent of a peak value thereof, is equal to the design width, the distribution being obtained by calculating a surface integral of a forward-scattering term of a basic exposure intensity distribution function over a pattern of interest; and an exposure dose correction step of determining a corrected exposure dose Qcp in such a way that a product of the corrected exposure dose Qcp and a sum of first and second values is substantially constant, where the first value is equal to the predetermined percent of the peak value and the second value is equal to an exposure intensity due to a backscattering term of the basic exposure intensity distribution function.

With the first aspect, since a self-correction step of changing a design width in consideration of a forward-scattering term is executed prior to an exposure dose correction step, and in the exposure dose correction step, a backscattering term is further considered on a result obtained in consideration of the forward-scattering term, therefore dimensions of a developed pattern can be those of design with good accuracy.

Further, since it is enough to consider only a single pattern of interest in the self-correction step, a great increase in calculation time can be suppressed.

If a half-width is adopted as a peak width, a change in dimension of a developed pattern due to an error in exposure dose is small since a gradient of the exposure intensity distribution at the height of a half of a peak value is roughly larger than at other positions.

If the exposure dose correction step is executed using a pattern area density method, calculation becomes comparatively easy.

According to the second aspect of the present invention, there is provided a charged particle beam exposure method with performing proximity effect correction comprising: partitioning a placement surface of an exposure pattern into meshes each smaller in area than a maximum size of one shot for pattern exposure; determining a pattern area density of each mesh; determining an effective pattern area density by smoothing the pattern area densities; determining an exposure intensity due to a backscattering term of a basic exposure intensity distribution function as a value proportional to the effective pattern area density; and performing auxiliary exposure on meshes each short of an exposure dose with one shot for a pattern.

With the second aspect since an auxiliary exposure shot for the meshes each smaller in area than a maximum size of one shot for pattern exposure are superimposed on a pattern exposure shot in simple data processing, the number of shots in a unit area can be decreased compared to a case of variable-shaped rectangular exposure without reducing dimensional accuracy in a developed pattern in a region where pattern area densities change rapidly.

Other aspects, objects and the advantages of the present invention will become apparent from the following detailed description taken in connection with the accompanying drawings.

BRIEF DESCRIPTION OF THE DRAWINGS

FIGS. 2(A) and 2(B) are illustrations for describing a self-correction in a case of exposing a rectangular pattern, wherein FIG. 2(A) shows a relation between a designed rectangular pattern 11 having a width $W_0$ in an X direction and a self-corrected rectangular pattern 12 having a width W in the X direction, and FIG. 12(B) is a graph showing an exposure intensity distribution along the X-axis when exposing with using the self-corrected rectangular pattern 12;

DESCRIPTION OF THE PREFERRED EMBODIMENTS

Figure 1:
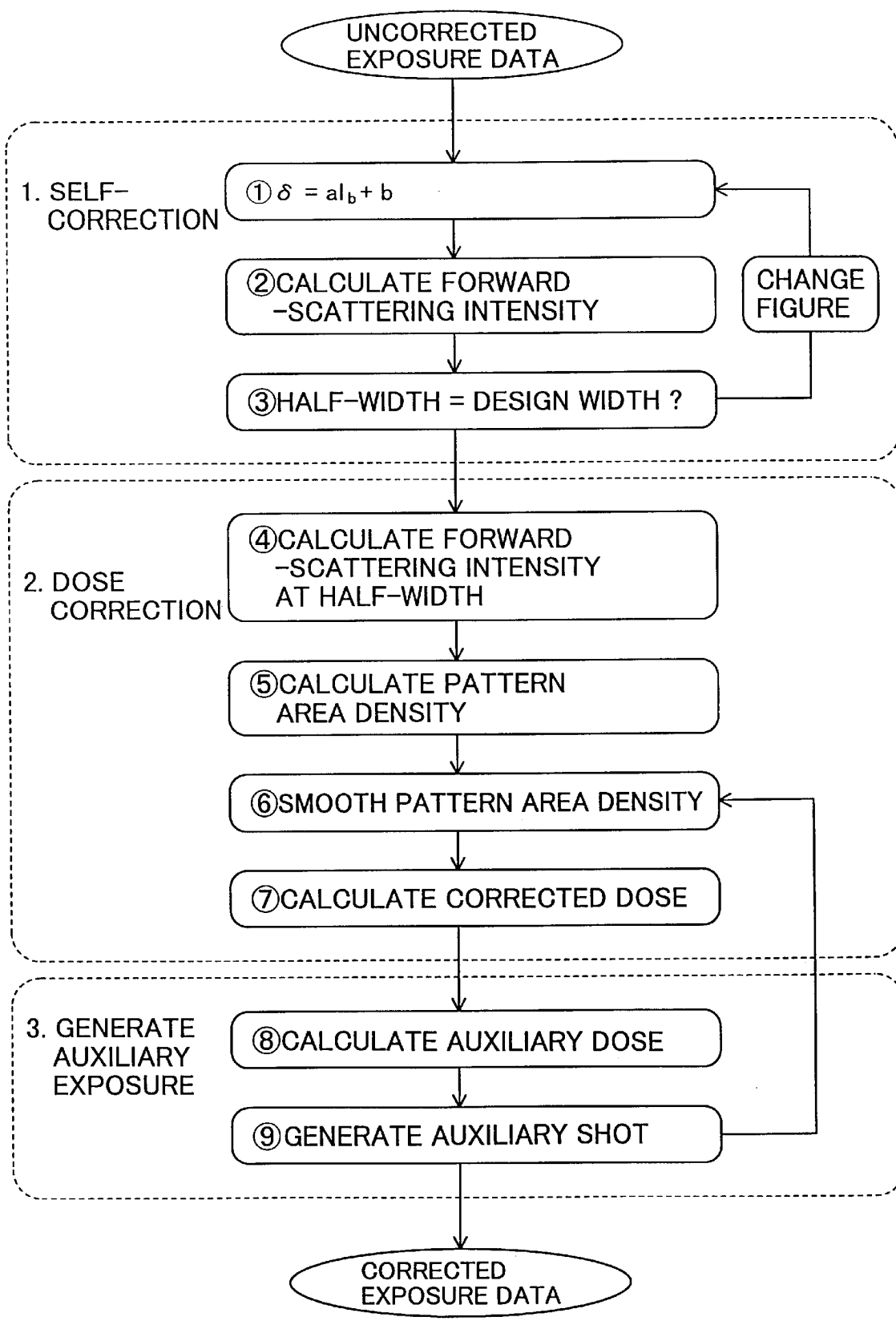
FIG. 1 is a general flow chart showing a procedure of a proximity effect correction method of the first embodiment according to the present invention.

Referring now to the drawings, wherein like reference characters designate like or corresponding parts throughout several views, preferred embodiments of the present invention are described below.

First, description will be made of a well known basic exposure intensity distribution function f(X, Y) in consideration of an electron beam blur δ caused by a Coulomb effect and so on.

Although the function f(X, Y) is one for a point incident electron beam, an actual electron beam has an expanse. In an electron beam exposure system, electrons of the electron beam emitted from an electron gun cross over at some points on the way to an exposure objective, and at the points, the electron beam broadens due to the mutual Coulomb repulsion of the electrons (Coulomb effect). Further, the electron beam also expands due to aberrations caused by the spread of electron energy distribution in the electron beam. The current density distribution at the incident spot of the electron beam is approximated by a Gaussian function S(X, Y), whose exponential part has $-(X^2+Y^2)/\delta^2$. Further, the blur δ is approximated as δ=a×Ib+b, where Ib is an electric current and a and b are constant. For example a=0.03 μm/A, b=0.05 μm. The electron beam current Ib is expressed by a product of a current density J of an irradiated electron beam on a mask and an aperture area S of an electron beam spot on the mask (an aperture area S of a selected block exposure pattern or a variable-shaped rectangular). In general, since the current density J is constant, a blur δ can be determined from the aperture area S with ease.

A basic exposure intensity distribution function F(X, Y) in which a beam blur is taken into consideration is expressed by the following equation.

$$F(X, Y) = \int_{-\infty}^{\infty} S(X', Y') f(X - X', Y - Y') dX' dY' \quad (2)$$

$$= \frac{1}{\pi(1+\eta)} \left\{ \frac{\eta}{\beta_f^2 + \delta^2} \exp\left(-\frac{X^2 + Y^2}{\beta_f^2 + \delta^2}\right) + \frac{\eta}{\beta_b^2 + \delta^2} \exp\left(-\frac{X^2 + Y^2}{\beta_b^2 + \delta^2}\right) \right\}$$

Letting an effective forward-scattering radius $\beta_f' = (\beta_f^2 + \delta^2)^{1/2}$ and an effective backscattering radius $\beta_b' = (\beta_b^2 + \delta^2)^{1/2}$, the equation (2) has the same form as that obtained by substituting $\beta_f'$ and $\beta_b'$ for $\beta_f$ and $\beta_b$, respectively, in the equation (1).

Further, for example, $\beta_b$=11.43 μm, Ib<1.5 μA and δ<0.1 μm, therefore it can be regarded that $\beta_b'=\beta_b$.

With the above relations, the equation (2) is expressed by the following equation.

$$F(X, Y) = \frac{1}{\pi(1+\eta)} \left\{ \frac{1}{\beta_f'^2} \exp\left(-\frac{X^2 + Y^2}{\beta_f'^2}\right) + \frac{\eta}{\beta_b^2} \exp\left(-\frac{X^2 + Y^2}{\beta_b^2}\right) \right\} \quad (3)$$

From the above discussion, in order to consider a Coulomb effect in proximity effect correction, an effective forward-scattering radius $\beta_f'$ dependent on an aperture area S is calculated for each shot and the resultant value is used.

Since, as described above, for example, $\beta_f$=0.028 μm, δ<0.1 μm and therefore $\beta_f'$ is short in comparison with a distance between adjacent patterns, it is only required to consider a single pattern of interest when only an influence of forward-scattering is considered, and an influence from nearby patterns can be neglected.

First Embodiment

Then, description will be made of an electron beams exposure method using a proximity effect correction method of the first embodiment according to the present invention.

FIG. 1 is a general flow chart showing a procedure of this proximity effect correction method. This method is classified into following three general steps. The first step is self-correction (local correction) in which only an influence of forward-scattering and a pattern of interest are considered. The second step is exposure dose correction (wide region correction) in which an influence of backscattering is considered. The third step is partitioning a region whose pattern area density changes rapidly into smaller areas than one shot area and generating auxiliary shots for correction requiring ones of the smaller areas. In general, a pattern of interest is each of all the patterns, but when all the patterns have a hierarchy, a pattern of interest is each of only one of mutually symmetrical groups in the hierarchy.

(1A) Self-correction

In self-correction, an exposure intensity distribution for each figure is calculated based on the forward-scattering term of the equation (3). Then, a dimensional shift, that is a change in figure, is performed in regard to an exposure pattern data in such a way that a half-width W of the distribution is equal to a design width $W_0$.

An example of self-correction will be described below.

Figure 2A:
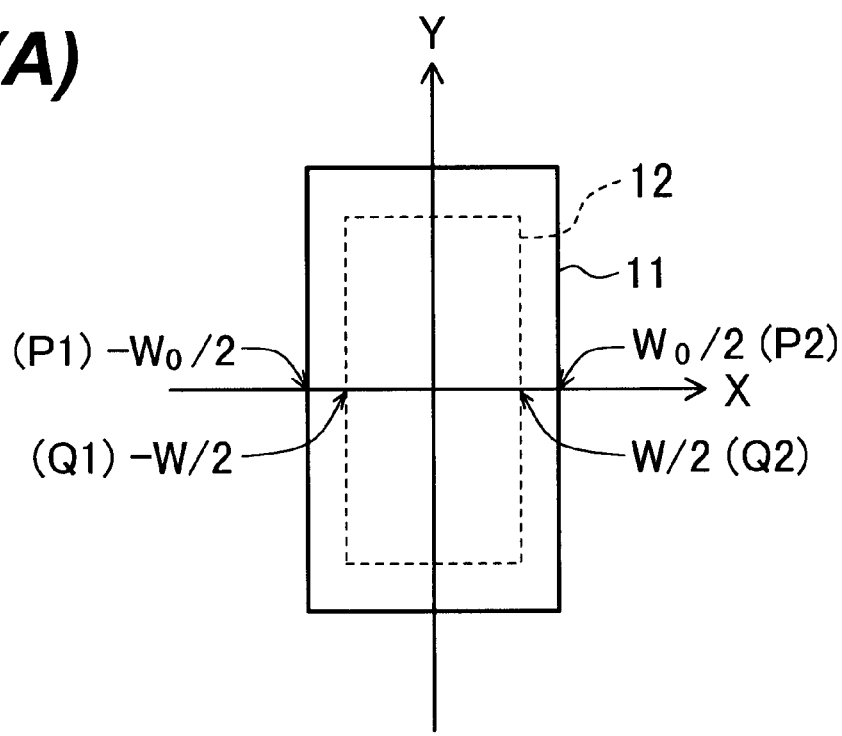
Figure 2B:
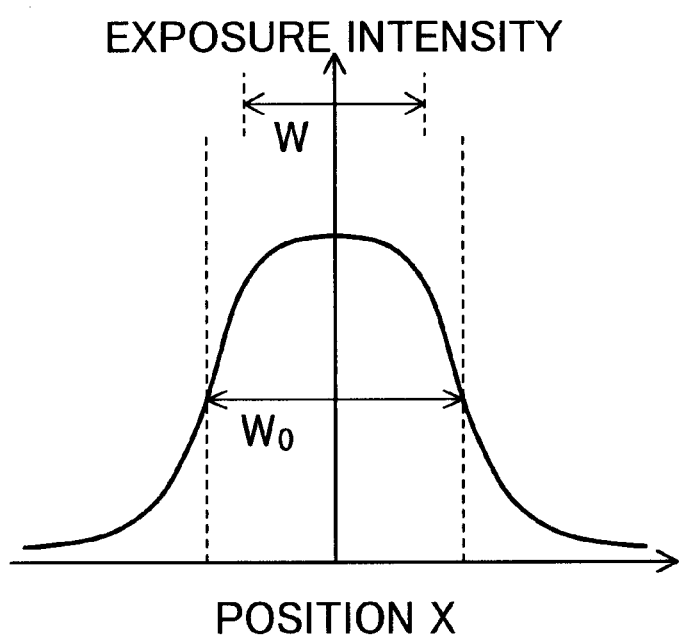

FIGS. 2(A) and 2(B) are illustrations for describing self-correction in a case of a rectangular pattern exposure. FIG. 2(A) shows a relation of a rectangular pattern 11 with a design width $W_0$ in an X direction and a rectangular pattern 12 with a self-corrected width W in the X direction. FIG. 2(B) is a graph showing an exposure intensity distribution Ef $(X, W/2, \beta_f)$ along the X-axis when the exposure is performed using the self-corrected pattern 12. The X-axis traverses opposite sides of a rectangular pattern 11 at a right angle passing through points P1 and P2 on the respective sides. By performing the self-correction, the points P1 and P2 move to respective points Q1 and Q2 of intersection between the X-axis and the rectangular pattern 12.

This distribution can be obtained by the surface integral of the forward-scattering term of the equation (3) on the pattern 12, and X directional part thereof is expressed by the following equation.

$$Ef\left(X, \frac{W}{2}, \beta_f'\right) = \frac{1}{\sqrt{\pi}\,\beta_f'}\int_{-W/2}^{W/2}\exp\left(-\frac{(X-X')^2}{\beta_f'^2}\right)dX' \quad (4)$$

$$= \frac{1}{2}\left\{erf\left(\frac{W-2X}{2\beta_f'}\right) - erf\left(\frac{-W-2X}{2\beta_f'}\right)\right\}$$

where an error function erf(X) is defined by the following equation.

$$erf(X) = \frac{2}{\sqrt{\pi}}\int_0^x \exp(-t^2)\,dt \quad (5)$$

(a) W is determined in such a way that the half-width of an exposure intensity distribution is equal to a design width $W_0$.

That is, a value of W is obtained in such a way that a value of Ef $(W_0/2, W/2, \beta_f')$ at the points $X=+/-W_0/2$ is equal to a half of a peak value Ef $(0, W/2, \beta_f')$. The value of W can be obtained by numerically solving the following equation.

$$erf\left(\frac{W-W_0}{2\beta_f'}\right) - erf\left(\frac{-W-W_0}{2\beta_f'}\right) = \frac{1}{2}\left\{erf\left(\frac{W}{2\beta_f'}\right) - erf\left(\frac{-W}{2\beta_f'}\right)\right\} \quad (6)$$

Note that a self-corrected width in the Y direction can be determined in the same way.

Figure 3:
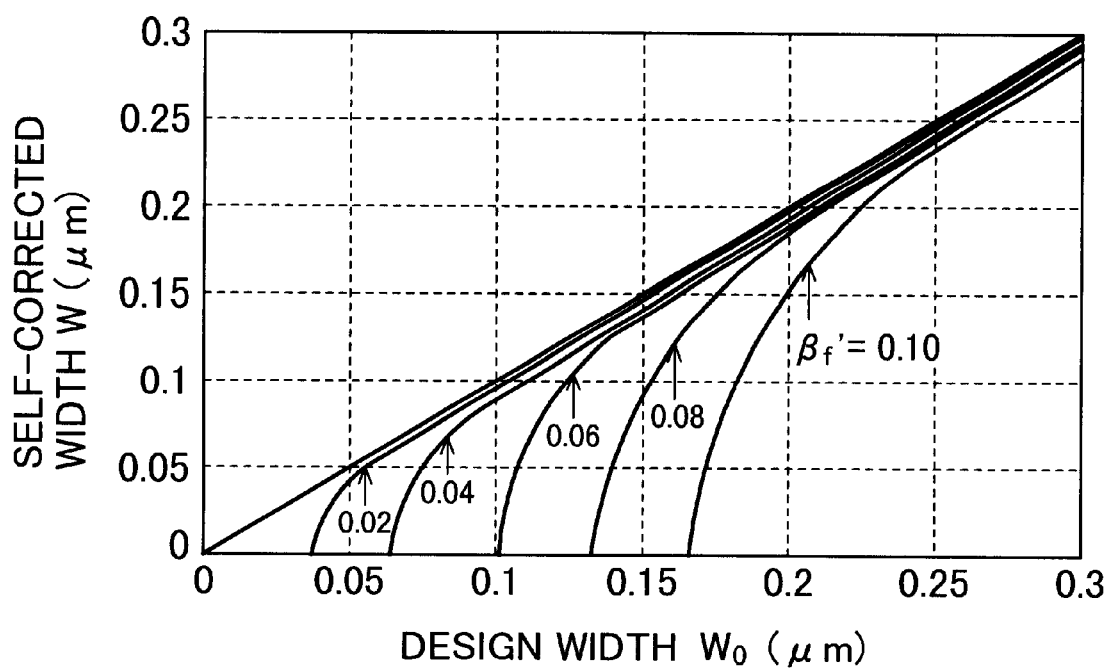
FIG. 3 is a graph showing relations between the design width $W_0$ and the numerical solution of the self-corrected width W satisfying an equation (6) with the parameter of an effective forward-scattering radius $\beta_f'$.

FIG. 3 shows relations between the design width $W_0$ and the numerical solution of the self-corrected width W satisfying the equation (6) with the parameter of the effective forward-scattering radius $\beta_f'$. It is seen from FIG. 3 that with the effective forward-scattering radius $\beta_f'$ is larger, and with the design width $W_0$ is shorter, the self-corrected width W is shorter than the design width $W_0$.

(b) For example, in a case where a block pattern is exposed by one shot using a stencil mask, since if $W_0$ changes to W, then the aperture area S of the block pattern changes, thereby the beam blur δ changes, therefore the value of $\beta_f'$ in the equation (3) changes.

(c) If the absolute value of the difference between the half-width calculated using the changed $\beta_f'$ and the design width $W_0$ is out of an allowable error range, then the process returns to the step (a).

Referring back to FIG. 2(B), since the gradient of the exposure intensity distribution at $X=+/-W_0/2$ is roughly larger than those at other points on the X-axis, a change in dimension of a developed pattern due to an error of exposure dose is small. This contributes to the improvement of dimensional accuracy.

Further, since a change in width is performed based on calculation of the exposure intensity of only the forward-scattering term, increase in calculation load is suppressed. If a table or an approximate equation showing a relation between $W_0$ and W is prepared in advance by numerical calculation on a basic pattern as described above, W can be obtained from $W_0$ with ease.

It should be noted that since the exposure intensity distribution due to forward scattering has comparatively large gradient in the vicinity of $X=+/-W_0/2$ and therefore, it is not necessarily to equate the half-width W with the design width $W_0$. Namely, adjusting a design width in such a way that a peak width of the exposure intensity distribution at a height of a predetermined percent, preferably a value in the range of 30% to 70%, of a peak value thereof is the design width, dimensional accuracy of a developed pattern will be improved compared with a prior art method.

The reason of the range limiting is as follows. If the predetermined percent is under 30%, a margin against dimensional variation will becomes small because of influence of superposition of adjacent peak profiles of the exposure intensity distribution due to forward scattering. If the predetermined percent is over 70%, a margin against dimensional variation will becomes small because of the gradient at the position on the exposure intensity distribution is gradual.

(2A) Exposure Dose Correction

First, description will be made, in a visual way, of contributions of forward-scattering and backscattering to an exposure intensity distribution when various patterns are used for exposure with reference to FIGS. 4(A) to 7(E).

FIGS. 4(A) to 4(E) show an isolated line pattern with a small width, a line and space pattern with a small line-width, an isolated line pattern with a large line-width, a line and space pattern with a large line-width and a large pattern.

FIGS. 5(A) to 5(E) show exposure intensity distributions along the X-axis on the patterns of FIGS. 4(A) to 4(E) on the assumption of δ=0, no forward-scattering and no backscattering. Peak values of the exposure intensity distributions are normalized to be 1. Exposure doses are set constant. That is, when the current density of an electron beam is constant, an exposure time of each shot is also constant.

FIGS. 6(A) to 6(E) show exposure intensity distributions along the X-axis on the respective patterns of FIGS. 4(A) to 4(E) in consideration of only forward-scattering. In this case, leak intensities of the isolated line pattern with a small width and the line and space pattern with a small line-width is both 1/κ, where the value of κ is larger than 1 and depends on a line width. Since an expanse of an exposure intensity due to forward-scattering is relatively narrow, peak exposure intensities of the isolated line pattern with a large width, the line and space pattern each with a large line-width and a large pattern are all 1 and the same as those of FIGS. 5(C) to 5(E).

Figure 4A:
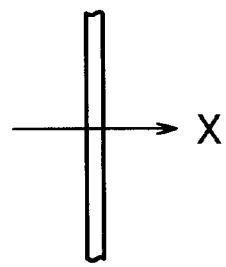
FIGS. 4(A) to 4(E) are illustrations showing designed patterns.
Figure 4B:
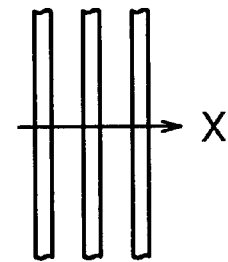
Figure 4C:
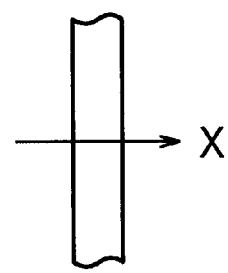
Figure 4D:
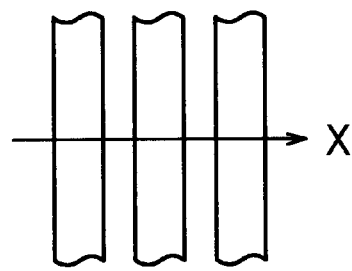
Figure 4E:
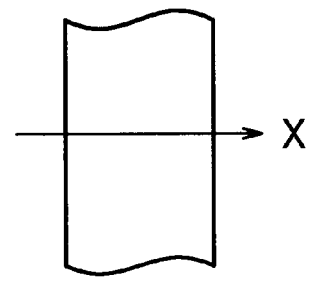
Figure 5A:
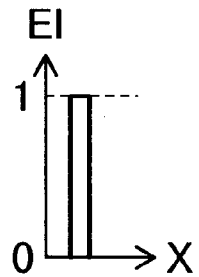
FIGS. 5(A) to 5(E) are:,graphs showing exposure intensity distributions along the X-axis on the patterns of FIGS. 4(A) to 4(E) on the assumption of δ=0, no forward-scattering and no backscattering.
Figure 5B:
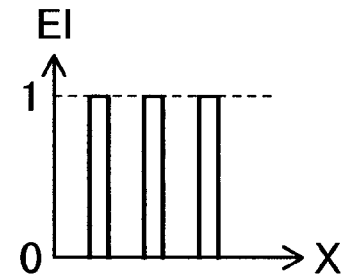
Figure 5C:
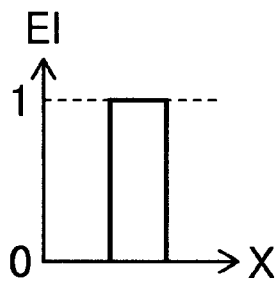
Figure 5D:
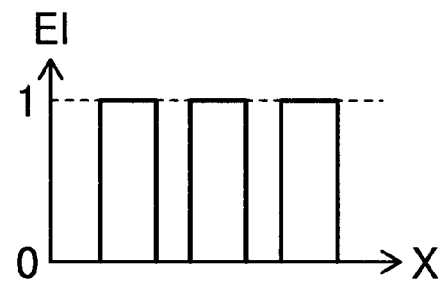
Figure 5E:
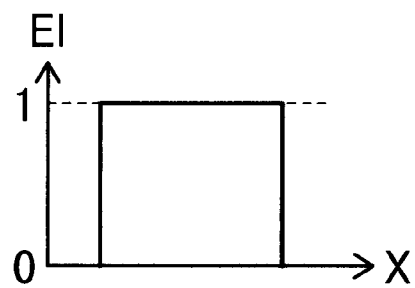
Figure 6A:
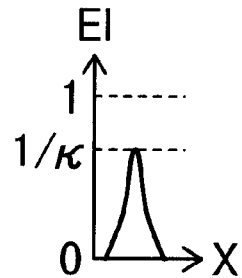
FIGS. 6(A) to 6(E) are, graphs showing exposure intensity distributions along the X-axis on the respective patterns of FIGS. 4(A) to 4(E) in consideration of only forward-scattering.
Figure 6B:
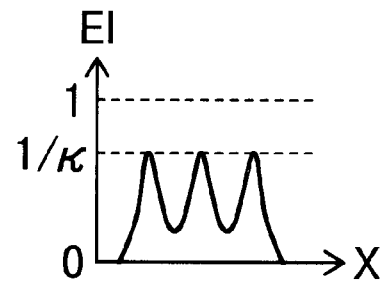
Figure 6C:
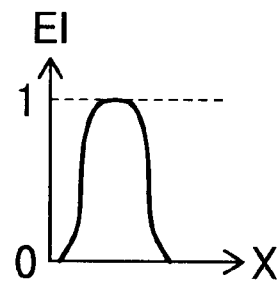
Figure 6D:
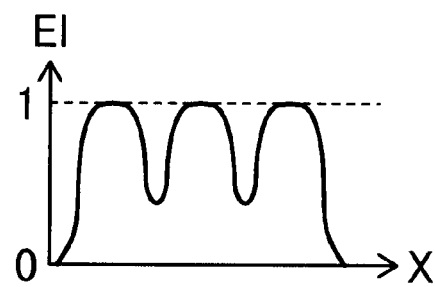
Figure 6E:
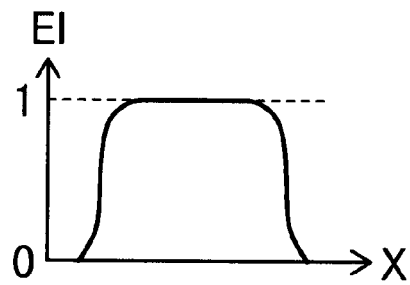

FIGS. 7(A) to 7(E) show exposure intensity distributions along the X-axis on the patterns of FIGS. 4(A) to 4(B) in consideration of forward-scattering and backscattering. In regard to the line and space patterns with 1 or less in pattern area density $\alpha_p$, here index p denotes its quantity is concerned with a pattern (this is the same hereinafter), the backscattering component of the exposure intensity is $\alpha_p\eta$ which is proportional to the pattern area density $\alpha_p$ and the backscattering ratio $\eta$. Although an influence of backscattering is exerted in a wide range, the backscattering term can be neglected in the isolated line patterns with a small width and a relatively large width since the value is comparatively small if it is not integrated with respect to area.

Figure 7A:
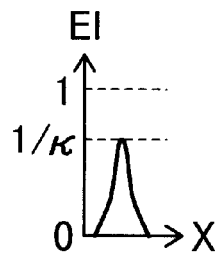
FIGS. 7(A) to 7(E) are;.graphs showing exposure intensity distributions along the X-axis on the patterns of FIGS. 4(A) to 4(E) in consideration of forward-scattering and backscattering.

It is defined herein that a half-peak intensity is a sum of a half of a peak intensity of a forward-scattering component and a backscattering component. Peak intensities and half-peak intensities are as follows:

In FIG. 7(A), a peak intensity is $1/\kappa$ and a half-peak intensity is $\frac{1}{2}\kappa$.

Figure 7B:
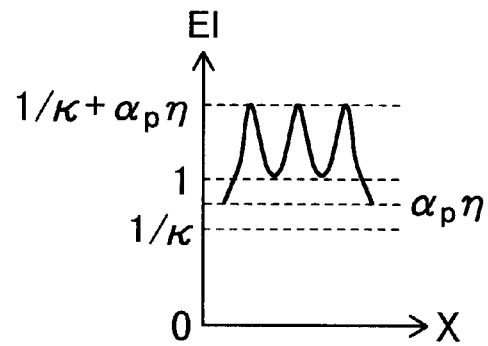

In FIG. 7(B),: a peak intensity is $1/\kappa+\alpha_p\eta$ and a half-peak intensity is $\frac{1}{2}\kappa+\alpha_p\eta$.

Figure 7C:
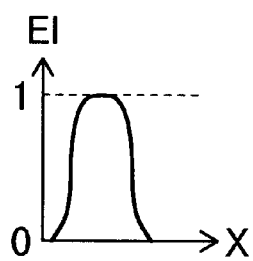

In FIG. 7(C), a peak intensity is 1 and a half-peak intensity is $\frac{1}{2}$.

Figure 7D:
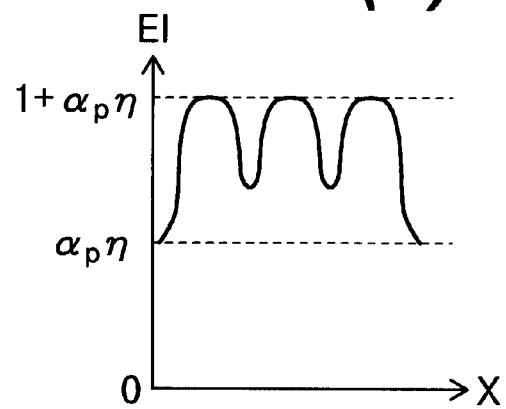

In FIG. 7(D), a peak intensity is $1+\alpha_p\eta$ and a half-peak intensity is $\frac{1}{2}+\alpha_p\eta$.

Figure 7E:
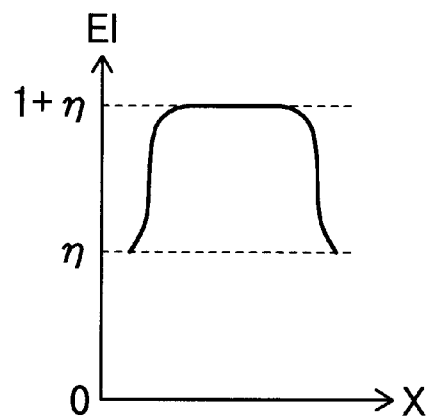

In FIG. 7(E), a peak intensity is $1+\eta$ and a half-peak intensity is $\frac{1}{2}+\eta$.

In summary, a peak intensity and a half-peak intensity are generally expressed as $1/\kappa+\alpha_p\eta$ and $\frac{1}{2}\kappa+\alpha_p\eta$, respectively. For example, FIG. 7(A) is a case of $\alpha_p=0$ and FIG. 7(E) is a case of $\kappa=1$ and $\alpha_p=1$.

It should be noted that as is apparent from the equation (1), an exposure intensity in each of FIGS. 7(A) to 7(E) is actually a value multiplied by a constant $(1+\eta)$, but this constant is omitted.

Then, description will be given of an outline of calculation of a corrected exposure dose.

Figure 8:
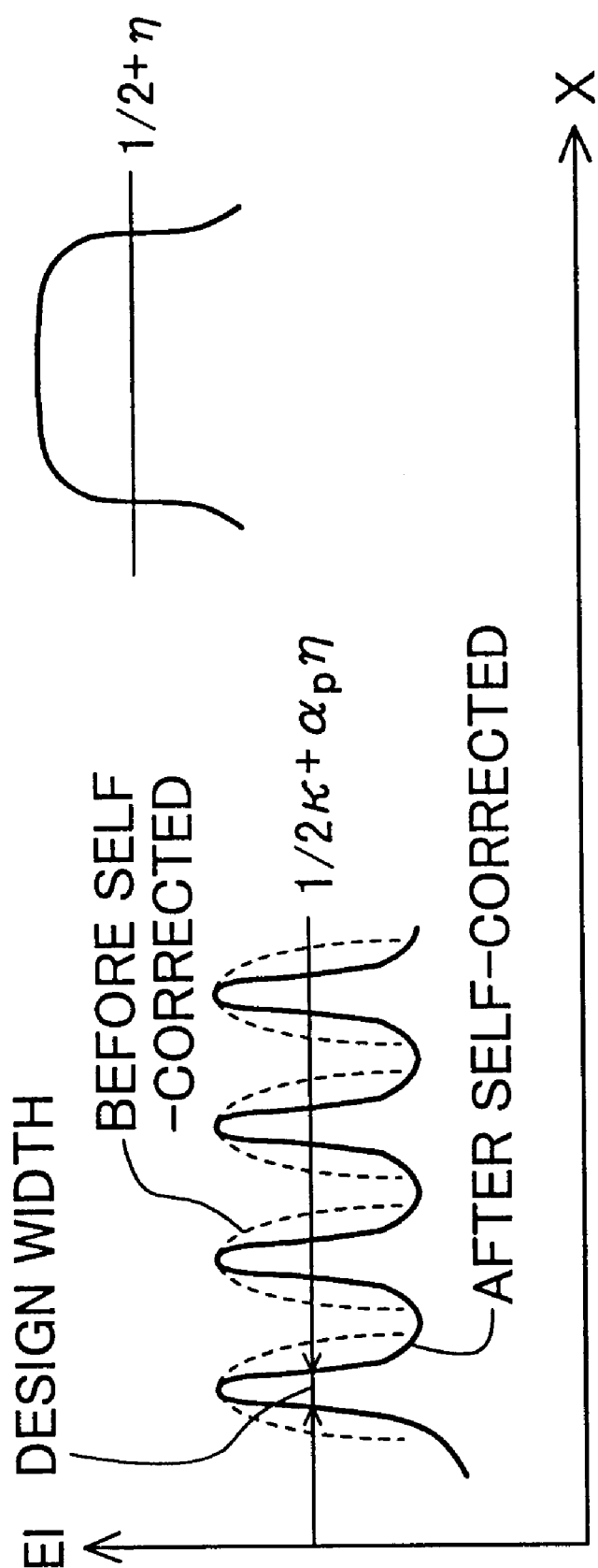
FIG. 8 is a graph showing exposure intensity distributions of a line and space pattern and a large pattern (a reference pattern) in consideration of forward-scattering and backscattering and without consideration of exposure dose correction.
Figure 9:
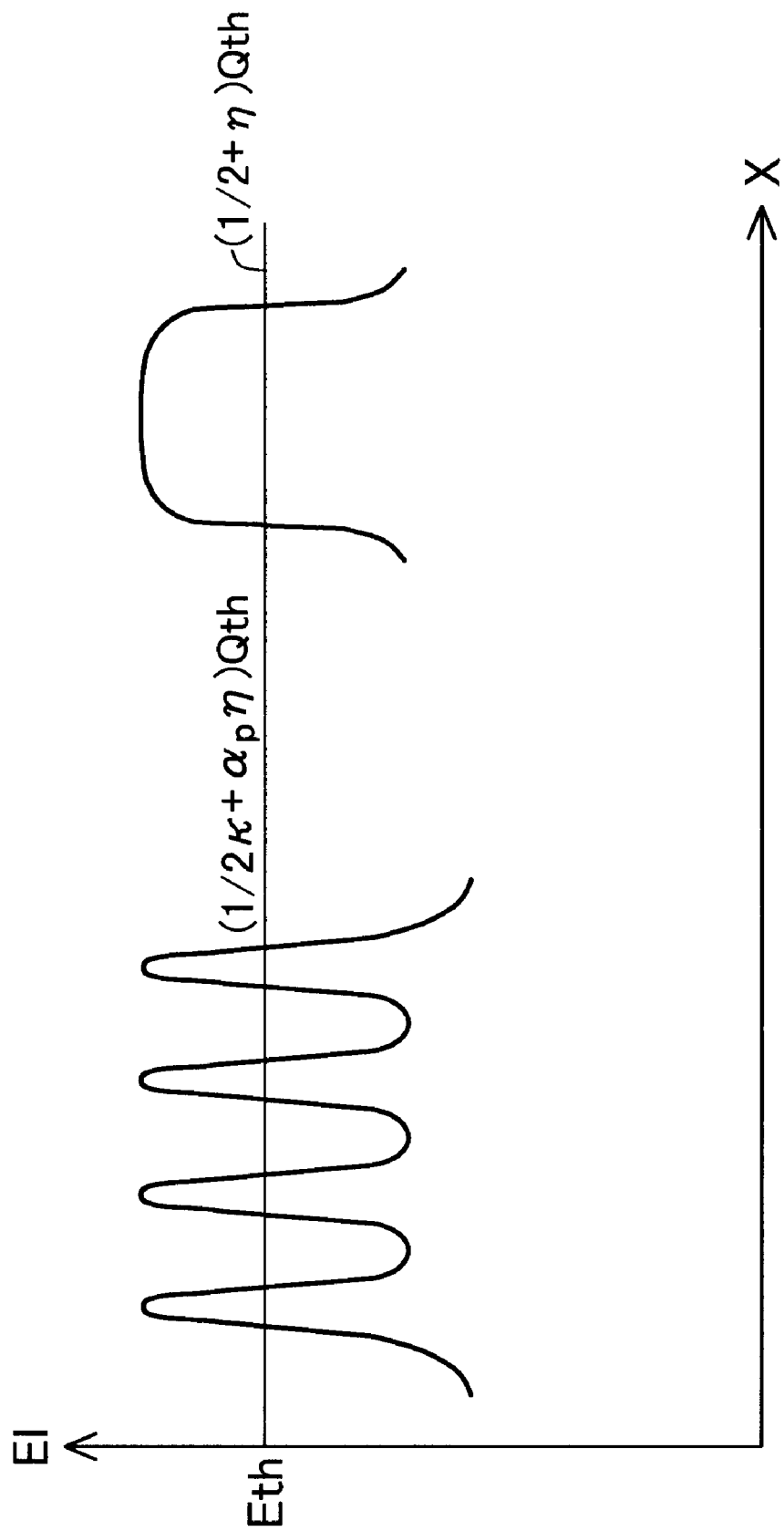
FIG. 9 is a graph showing exposure intensity distributions in additional consideration of exposure dose correction to the distributions of FIG. 8.

FIG. 8 is a graph showing exposure intensity distributions of a line and space pattern and a large pattern (a reference pattern) in consideration of forward-scattering and backscattering and without consideration of exposure dose correction. FIG. 9 is a graph showing exposure intensity distributions in additional consideration of exposure dose correction to the distribution of FIG. 8.

Exposure is carried out in such a way that a half-peak exposure intensity of every pattern is equal to a threshold value Eth for development. That is, the correction is carried out in such a way that a half-peak exposure intensity $(\frac{1}{2}\kappa+\alpha_p\eta)Qcp$ after the correction is equal to a half-peak exposure intensity $(\frac{1}{2}+\eta)Qth$ of a reference pattern, for example the above-described large pattern. Herein, Qcp is a corrected exposure dose. The following equation holds.

$$(1/\kappa+2\alpha_p\eta)Qcp=(1+2\eta)Qth \quad (7)$$

Here, Qth is experimentally determined as such an exposure dose at which the developed reference pattern size becomes its designed value. This is equivalent as the dose Qth that satisfy the relation ship $(\frac{1}{2}+\eta)Qth=Eth$.

Therefore, the corrected exposure dose Qcp is expressed by the following equation.

$$Qcp=\{(1+2\eta)/(1/\kappa+2\alpha_p\eta)\}Qth \quad (8)$$

With such a corrected exposure dose Qcp, a half-peak exposure intensity of each Pattern becomes equal to the threshold value Eth for development, therefore each developed pattern dimension can be its design width with good accuracy.

In order to separate correction computation from development process dependent Qth or Eth, normalized dose $d_p$ is defined as follows.

$$d_p=Qcp/Qth=\{(1+2\eta)/(1/\kappa+2\alpha_p\eta)\} \quad (8')$$

However, hereinafter explanations are made following convention in (8) for simplicity.

In the above, although the pattern area density $\alpha_p$ is used for simplicity, in actual fact, $\alpha_p$ is an effective pattern area density $\alpha_{p'}$ described below.

Then, detailed description will be given of calculation of a corrected exposure dose.

Figure 10:
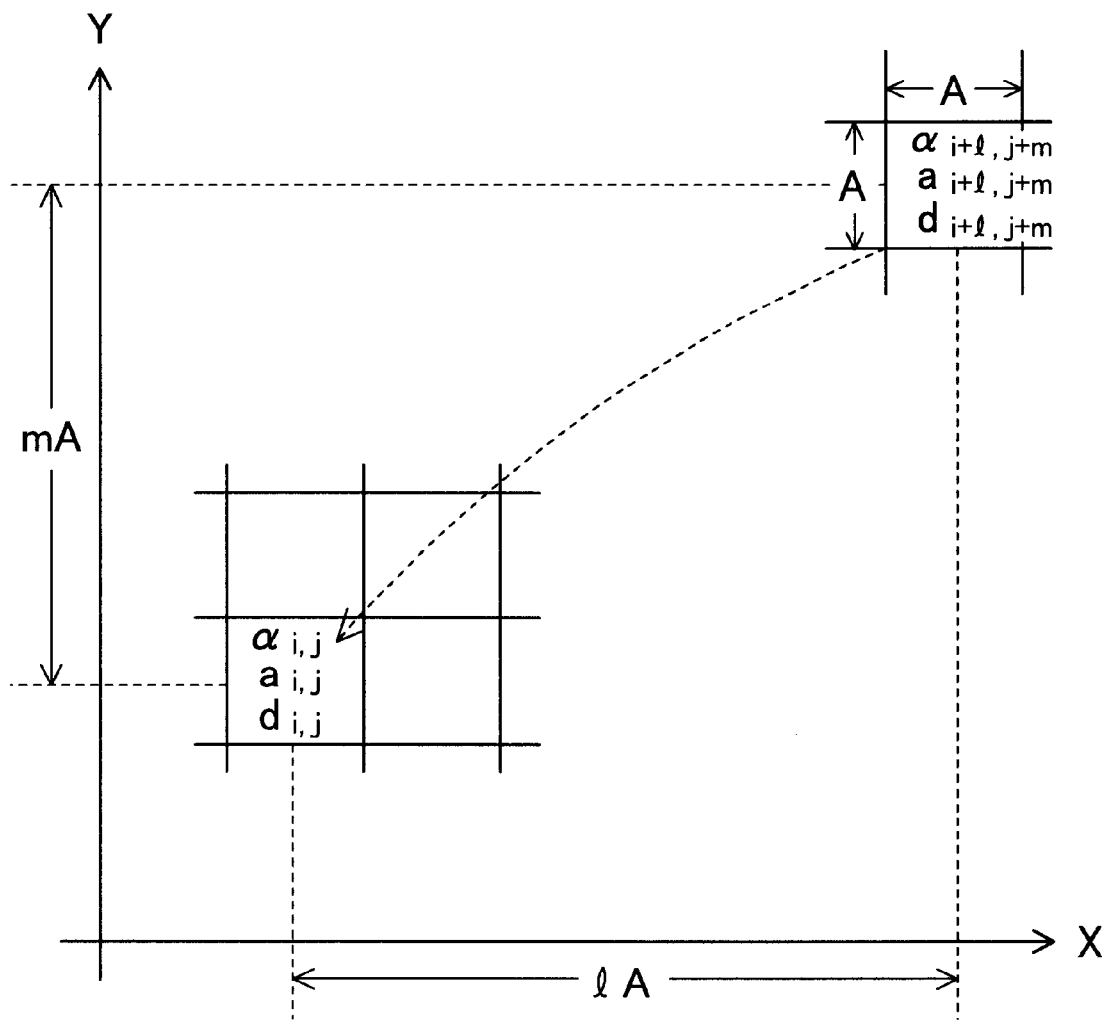
FIG. 10 is an illustration of a pattern area density method.

As shown in FIG. 10, a surface on which a pattern of exposure data is placed is partitioned into rectangular meshes each of A×A in size. If the full area of a mesh (i+l, j+m) is exposed, an exposure intensity $a_{i+l, j+m}$ at a middle point of a mesh (i, j) due to the backscattering is obtained by estimating a surface integral of the backscattering term of the equation (3) over the mesh (i+l, j+m), which is expressed by the following equation.

$$a_{l,m} = \frac{1}{\pi\beta_b^2}\int_{lA-A/2}^{lA+A/2}\exp\left(-\frac{X^2}{\beta_b^2}\right)dX\int_{mA-A/2}^{mA+A/2}\exp\left(-\frac{Y^2}{\beta_b^2}\right)dY \quad (9)$$

$$= \frac{1}{4}\left\{erf\left(\frac{(l+1/2)A}{\beta_b}\right)-erf\left(\frac{(l-1/2)A}{\beta_b}\right)\right\}\times$$

$$\left\{erf\left(\frac{(m+1/2)A}{\beta_b}\right)-erf\left(\frac{(m-1/2)A}{\beta_b}\right)\right\}$$

This equation (9) is normalized in such a way that a surface integral of the backscattering term of the equation (3) with respect to all over the area is 1, i.e. for any (i, j), the summation $\Sigma a_{i+l, j+m}$ with respect to all the values of l and m is equal to 1. l=0 and m=0, that is $a_{i,j}$, is an exposure intensity at the middle point due to backscattering in a self mesh.

Letting a pattern are density in the mesh (i+l, j+m) be $\alpha_{i+l, j+m}$, $\alpha_{i+l, j+m}$=(Area of pattern in mesh (i+l, j+m))/$A^2$.

When a pattern in the mesh(i+l, j+m) is exposed with a specific exposure dose $d_{i+l, j+m}$=(corrected exposure dose)/(reference exposure dose)=Qcp/Qth, the exposure intensity in the mesh (i, j) due to backscattering is approximated by $\eta\times a_{i+l, j+m}\times\alpha_{i+l, j+m}\times d_{i+l,j+m}\times$Qth. An influence of backscattering to a point is sufficiently evaluated in calculation accuracy if a circular area of a radius $2\beta_b$ about the point as a center, is taken into consideration. Therefore, the exposure intensity in the mesh (i, j) due to backscattering is approximated by $\eta\alpha'_{i,j}Qcp=\eta\beta'_{i,j}d_{ij}Qth$ if an effective pattern area density $\alpha'_{i, j}$ is defined by the following equation.

$$\alpha'_{i,j} = \sum_l\sum_m a_{i+l,j+m}\alpha_{i+l,j+m}d_{i+l,j+m} \quad (10)$$

Herein, the ranges of :,the integers l and m are both—int $(2\beta_b/A)$ to int$(2\beta_b/A)$, where int(x) is a function for rounding up x to an integer. Calculation of the equation (10) is called as smoothing.

Figure 11:
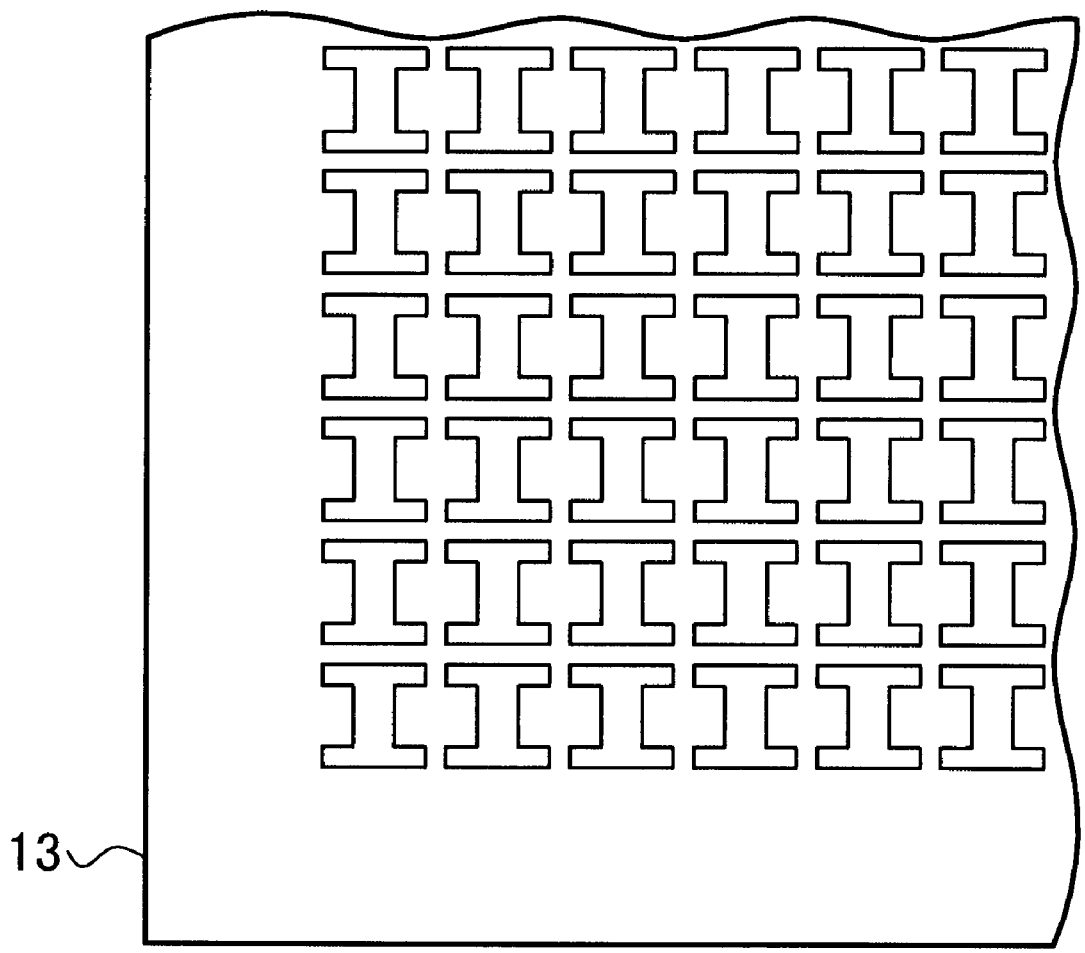
FIG. 11 is a cell array pattern in a corner where effective pattern area densities change rapidly.

For example, when the same pattern is repeated as a cell array shown in FIG. 11, a throughput can be increased if a stencil mask is used and a block pattern, for example one I-shaped pattern, is exposed with one shot.

A throughput is increased with increase in block pattern size. However, if the block pattern size is relatively large, the deviation of developed pattern sizes becomes out of an allowable range in a region where effective pattern area densities change rapidly, for example in a cell array corner portion 13 as shown in FIG. 11. In such a region, auxiliary exposure shots are superimposed on each block exposure. The shot size of the auxiliary exposure is smaller than a block shot size and same as the mesh size.

For example, the block shot size is a square with a side of 4.5 μm and the mesh size is a square with a side of 1.5 μm.

Figure 12:
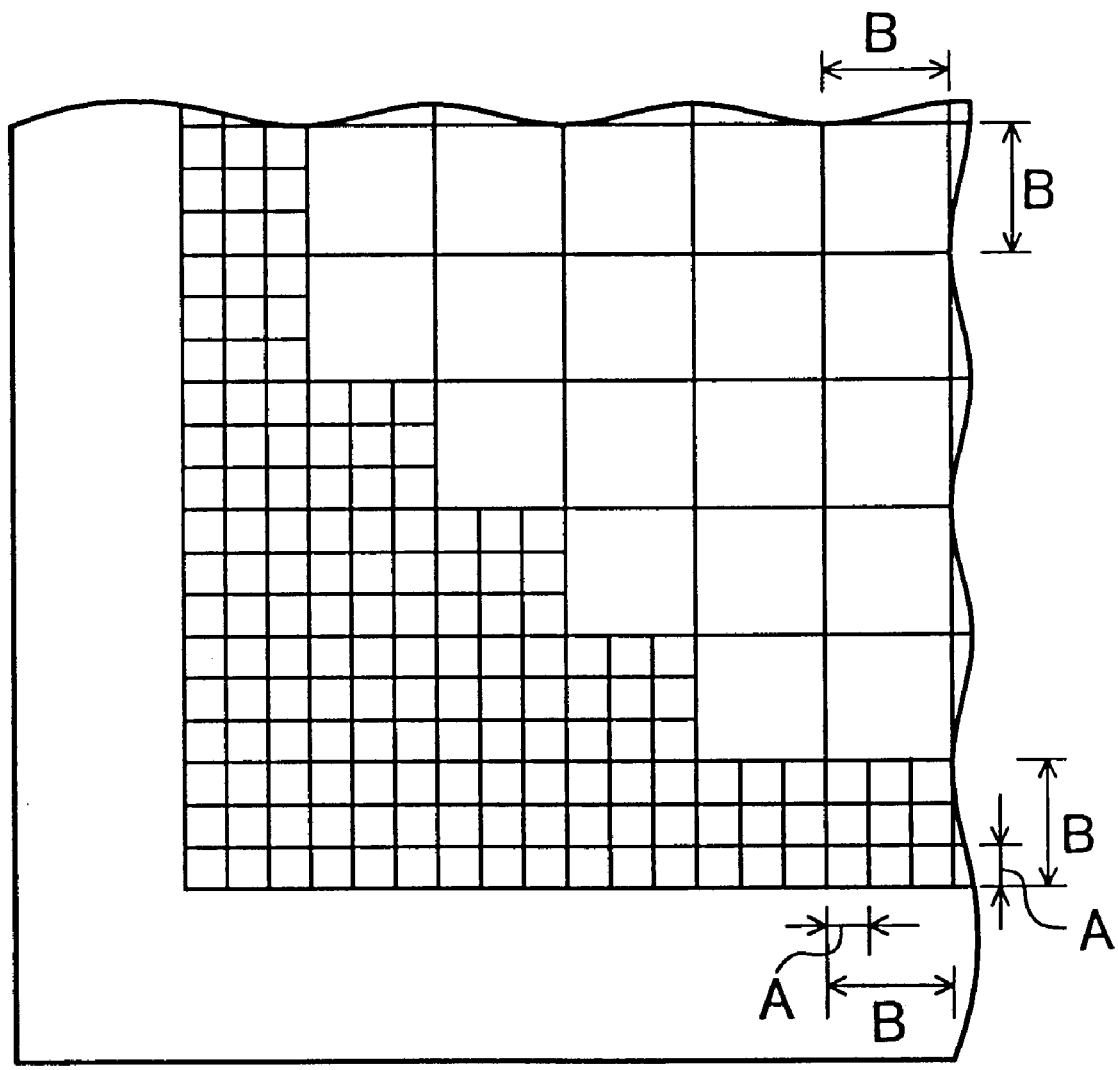
FIG. 12 is an illustration of meshes each of which is a unit for calculating a pattern area density of FIG. 11.

In FIG. 12, each square of B×B shows the boundary of a block shot, and each square of A×A shows a mesh. In FIG. 12, there are shown meshes only where effective pattern area densities change rapidly, although the meshes are formed on all the surface of the pattern placement, more concretely each sub field which is a scanning area of a sub deflector.

Figure 13:
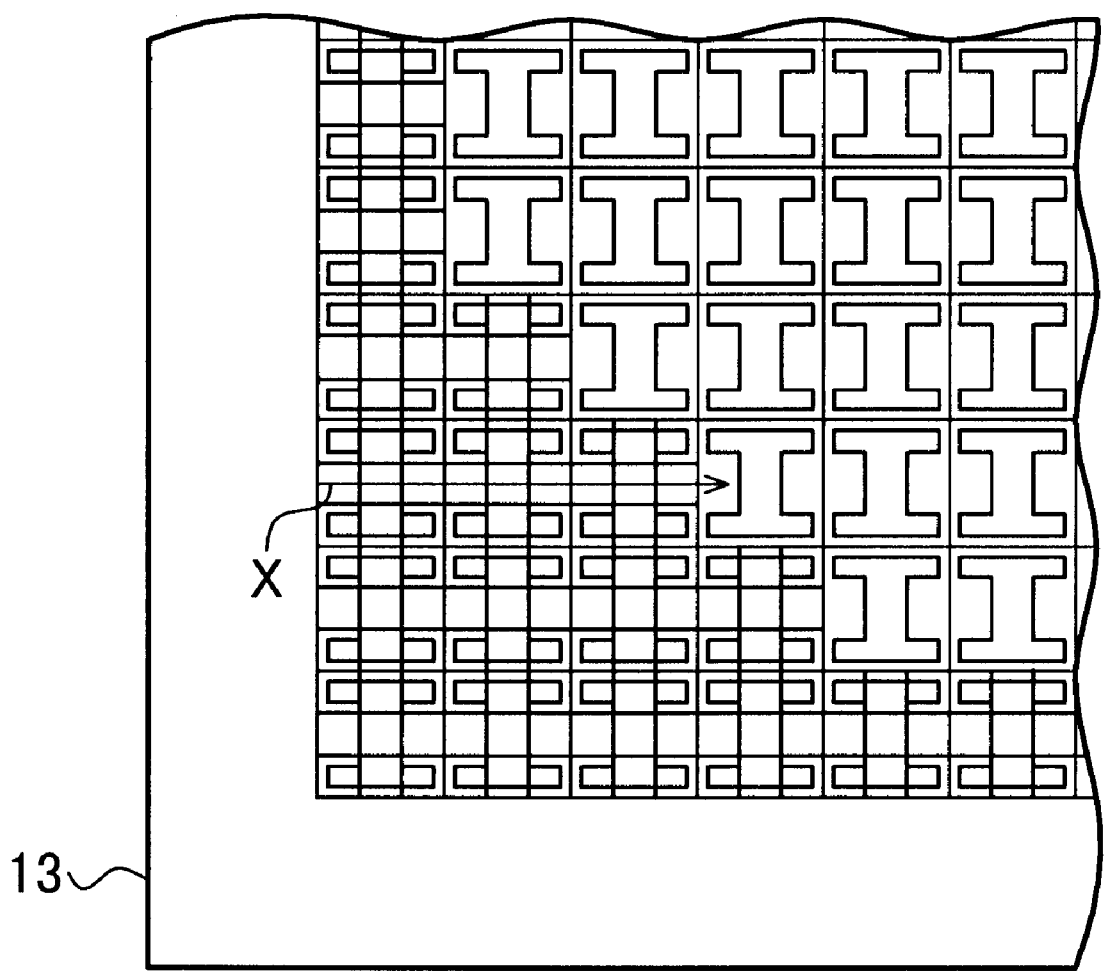
FIG. 13 is a superimposition view of FIGS. 11 and 12.

FIG. 13 is a view obtained by superimposing FIGS. 11 and 12 on each other.

Exposure dose correction is performed in such a way that a half-peak exposure intensity (½κ+$α_p$'η) Qcp of each pattern becomes equal to the threshold value Eth while repeatedly updating a value of $d_{i,j}$ whose initial value is equal to 1.

In a region where changes in effective pattern area density are gradual, only the above-described processings (1A) and (2A) can confine a dimensional error of a developed pattern within an allowable range.

(3) Generation of Auxiliary Shot

In a region where effective pattern area densities change rapidly, exposure is [1]performed superimposing a shot of auxiliary exposure (an auxiliary shot) on a shot of block exposure (a block shot). In an auxiliary shot, a rectangular electron beam size is made to coincide with a mesh of A×A, and exposure is performed in focus.

An exposure dose of an auxiliary shot (an auxiliary exposure dose) is determined as follows. That is, the above-described processing (2A) and the following processing are repeated as one loop.

Effective pattern area densities of meshes i1 to i9 of 3×3 matrix included in the i-th block shot are denoted as α'(i, 1) to α'(i, 9), respectively, and the maximum thereof is denoted as α'(i, m).

The corrected exposure dose Qcp.i of the i-th block shot is determined by the following equation obtained by substituting α'(i, m) for $α_p$ in the equation (8).

$$Qcp.i=\{(1+2\eta)/(1/\kappa+2\eta\alpha'(i,m))\}Qth \qquad (11)$$

Figure 14:
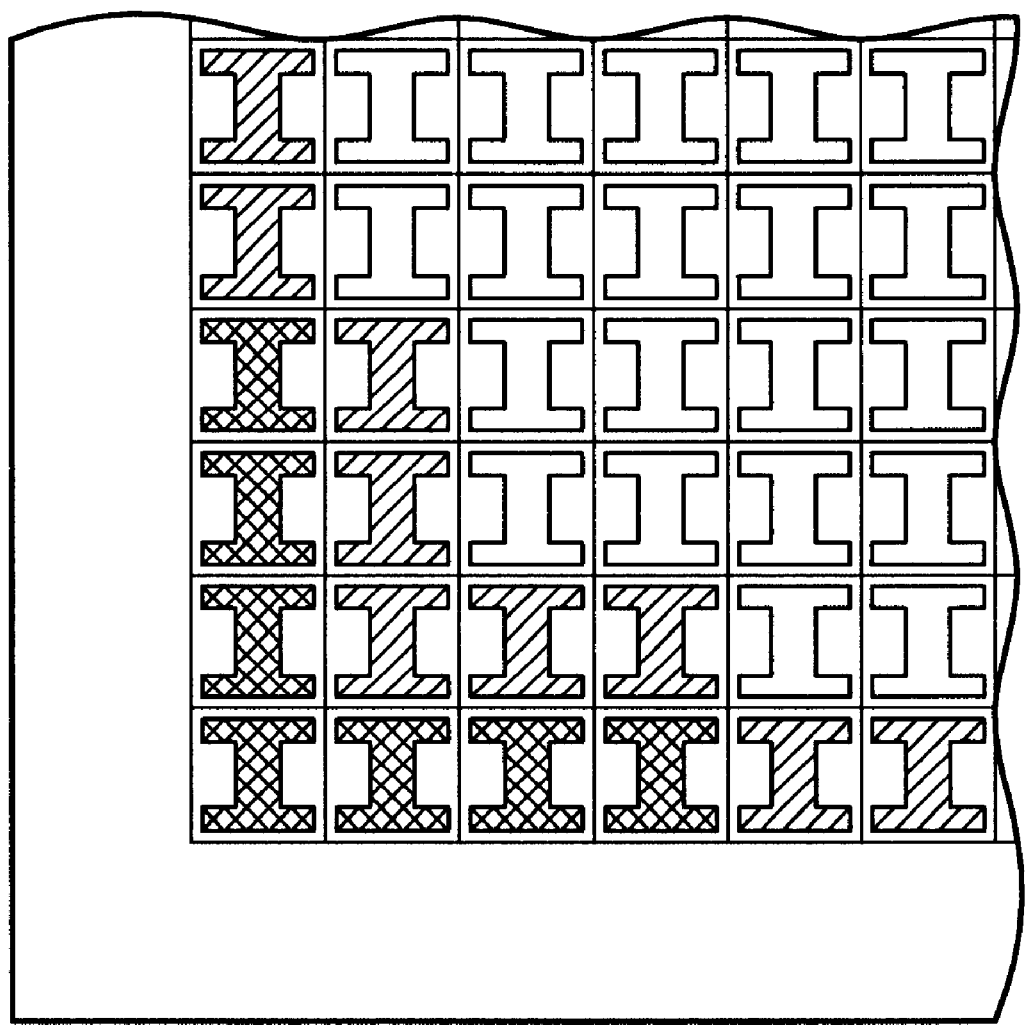
FIG. 14 is an illustration of a corrected exposure dose distribution of block shots.

FIG. 14 is an illustration of a corrected exposure dose distribution of block shots determined in such a manner. Corrected exposure doses EI1 to EI3 of FIG. 14 have a relation of EI1>EI2>EI3.

An auxiliary exposure dose Qaux.i (k) of a mesh ik, where k is any one of 1 to 9, in the i-th block shot is determined in such a way that for each pattern, the sum of a half-peak exposure intensity (½κ+α'(i, k)η) Qi.cp due to the dose correction and an auxiliary exposure dose Qaux.i (k) is equal to the half-peak exposure intensity (½+η)Qth, that is, the following equation holds.

$$(½\kappa+\alpha'(i,k)\eta)\ Qi.cp+Qaux.i\ (k)=(½+\eta)Qth \qquad (12)$$

Qcp.i is determined such that Qaux.i (k)=0 for k=m, thereby the following equation is derived from equation (12).

$$(½\kappa+\alpha'(i,m)\eta)\ Qi.cp=(½+\eta)Qth \qquad (13)$$

From equations (12) and (13), the following equation is derived.

$$Qaux.i(k)=(\alpha'(i,m)-\alpha'(i,k))\eta Qcp.i \qquad (14)$$

In a region where Qaux.i(k)=0, no auxiliary shot is generated. In a region where effective pattern area densities change gently, Qaux.i(k)=0, therefore auxiliary shot is generated only in a region where effective pattern area densities change rapidly.

Figure 15:
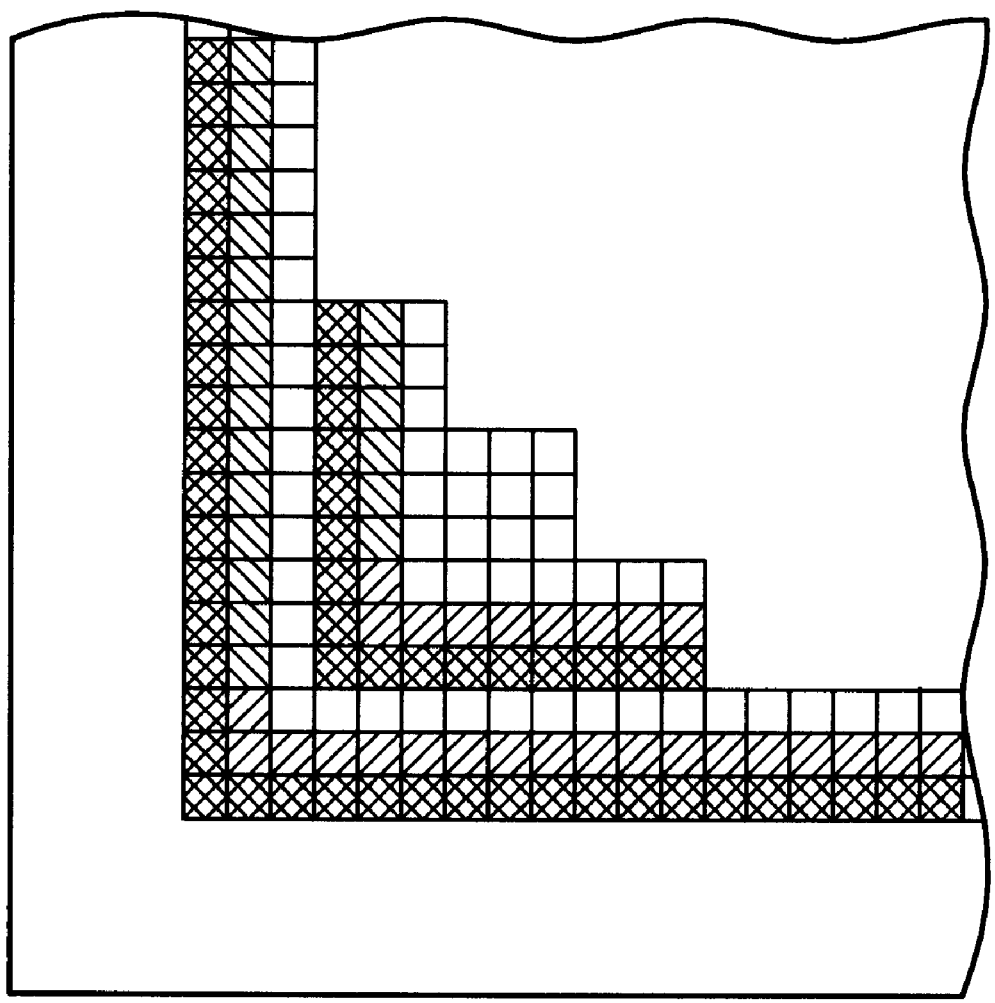
FIG. 15 is an illustration of an exposure dose distribution of an auxiliary shot.

FIG. 15 is an illustration of an exposure dose distribution of auxiliary shots determined in such a way. In FIG. 15, the exposure doses EI4 to EI6 have a relation of EI4>EI5>EI6= 0.

It is noted that the relation of Qaux.i(k)>Δ·Qcp.i, i.e. (α'(i, m)−α'(i, k))η>Δ may be used for determining a generation of an auxiliary shot, where Δ is determined depending on a required precision of a developed pattern, and for example, Δ=0.05 or 0.01, which means an omitting dose smaller than 5% or 1% of correction dose, respectively.

Figure 16A:
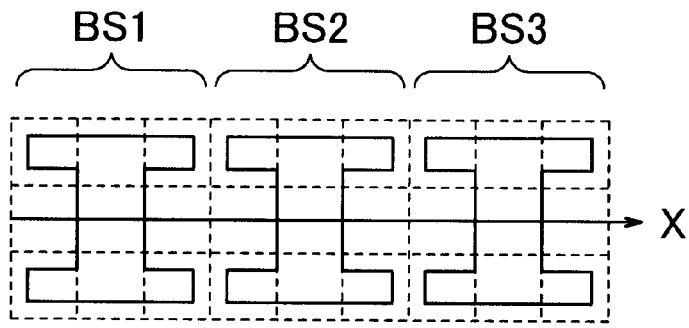
FIG. 16(A) is an enlarged view of part of FIG. 13.
Figure 16B:
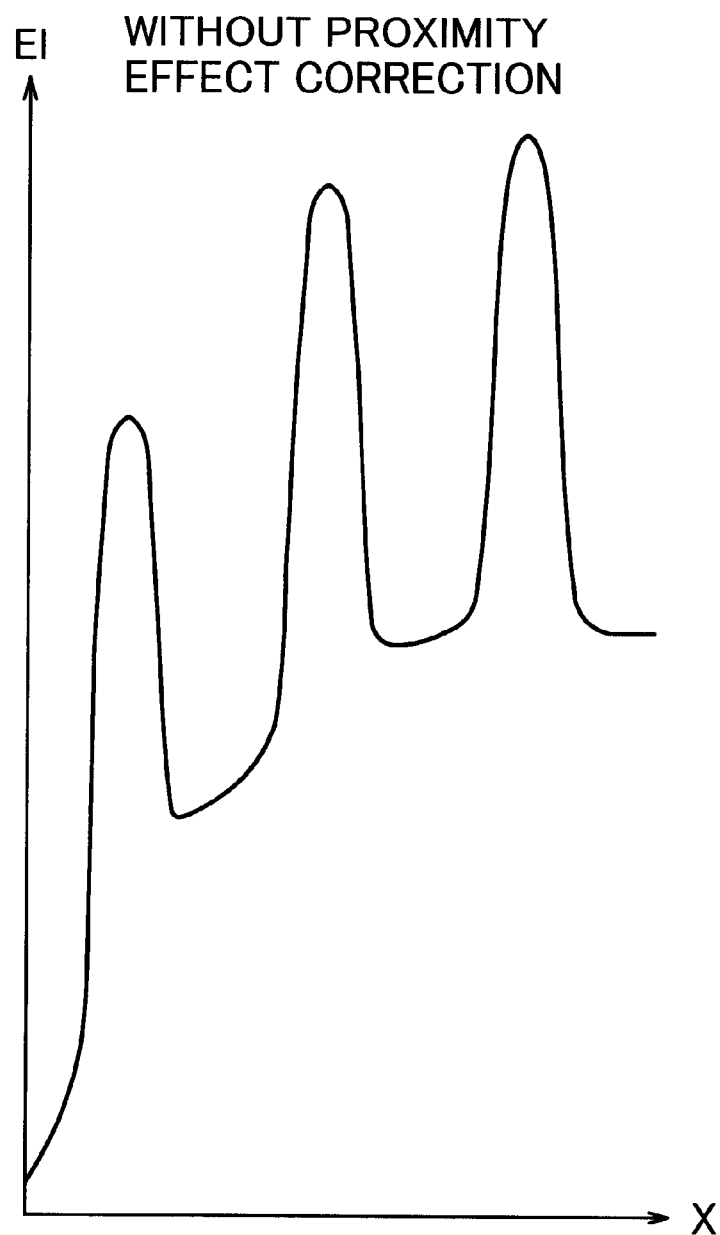
FIG. 16(B) is a graph showing an exposure intensity distribution along the X-axis on FIG. 16(A) in a case where no proximity effect correction is applied to the block shots BS1 to BS3 of FIG. 16(A)
Figure 17:
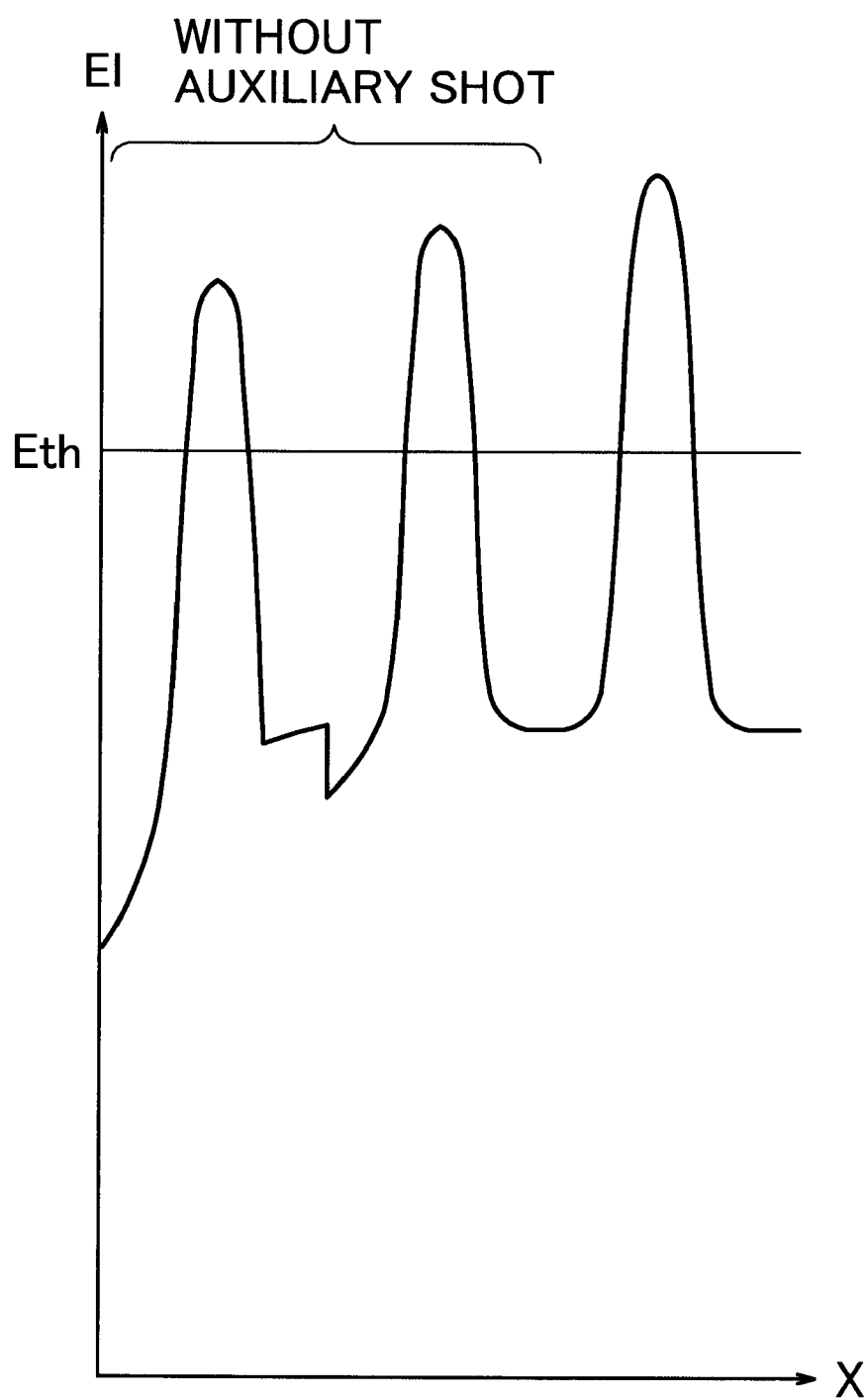
FIG. 17 is a graph showing an exposure intensity distribution along the X-axis on FIG. 16(A) in a case where proximity effect correction is applied to the block shots BS1 to BS3 of FIG. 16(A) in units of a block shot.
Figure 18:
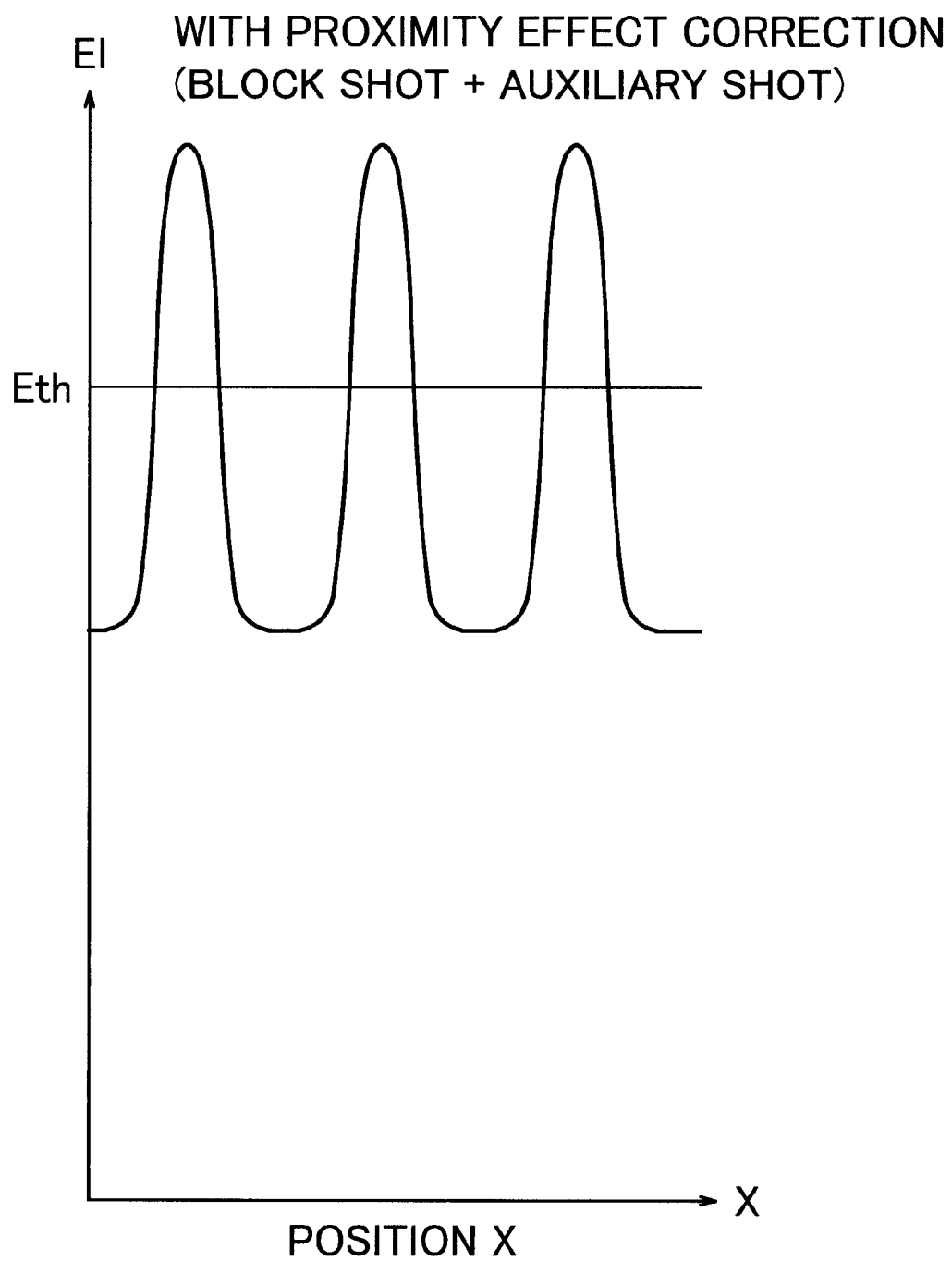
FIG. 18 is a graph showing an exposure intensity distribution along the X-axis on FIG. 16(A) in a case where proximity effect correction is applied to the block shots BS1 to BS3 of FIG. 16(A) in units of a block shot and auxiliary shots are further applied in units of a mesh.
Figure 19:
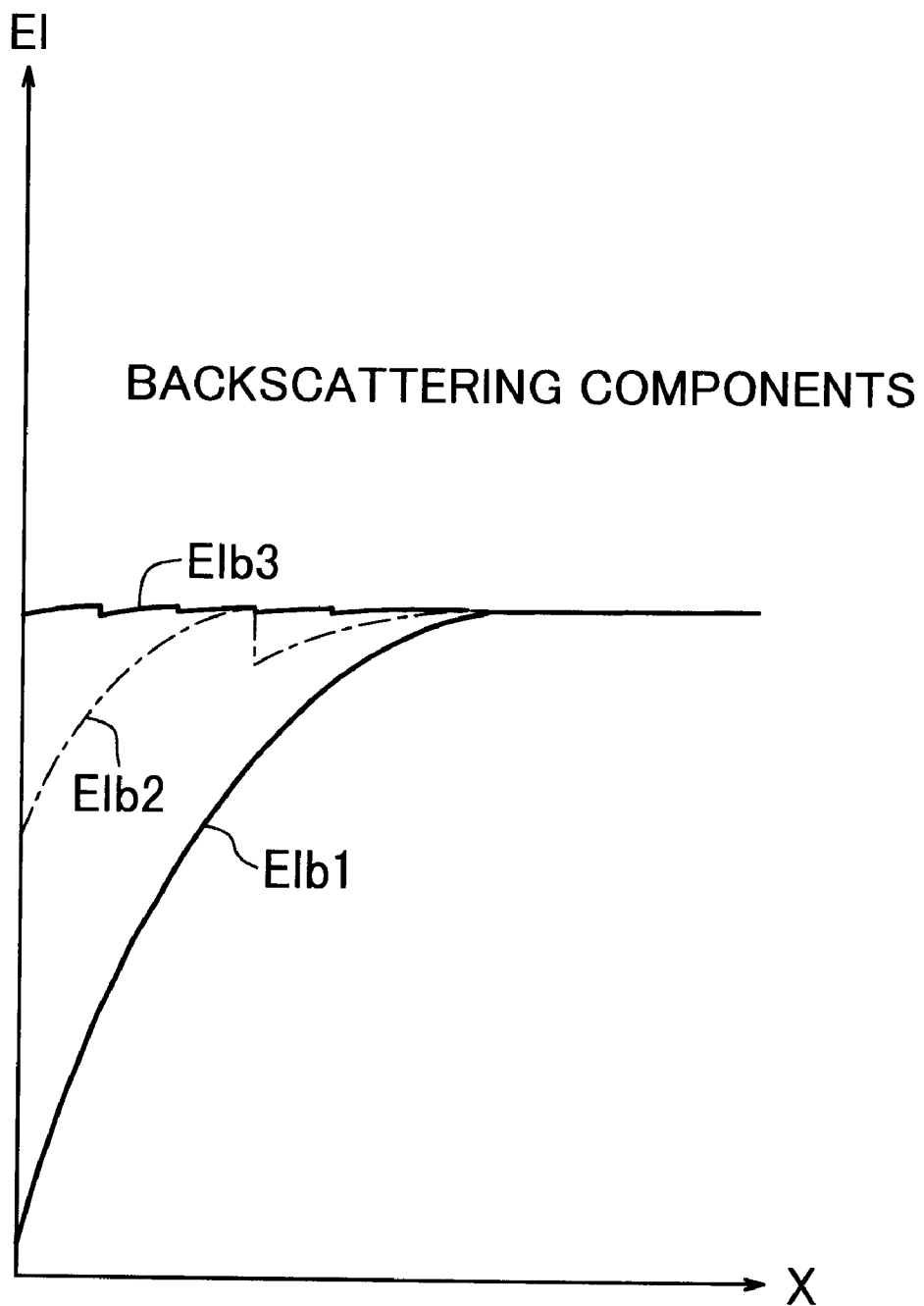
FIG. 19 is a graph showing backscattering components EIb1 to EIb3 of the exposure intensity distribution of FIGS. 16(B), 17 and 18, respectively.

FIG. 16(A) is an enlarged view of part of FIG. 13. FIG. 16(B) is a graph showing an exposure intensity distribution along the X-axis on FIG. 16(A) in a case where no proximity effect correction is applied to the block shots BS1 to BS3 of FIG. 16(A). FIG. 17 is a graph showing an exposure intensity distribution along the X-axis on FIG. 16(A) in a case where proximity effect correction is applied to the block shots BS1 to BS3 of FIG. 16(A) in units of a block shot. FIG. 18 is a graph showing an exposure intensity distribution along the X-axis on FIG. 16(A) in a case where proximity effect correction is applied to the block shots BS1 to BS3 of FIG. 16(A) in units of a block shot and auxiliary shots are further applied in units of a mesh. FIG. 19 is a graph showing backscattering components EIb1 to EIb3 of the exposure intensity distribution of FIGS. 16(B), 17 and 18, respectively.

A size of a mesh is determined in balance between required dimensional accuracy of a developed pattern and a calculation time for correction.

Then, description will be exactly made of above processings (2A) and (3) with reference to FIG. 1.

④ A half of a peak intensity Ef ($W_0/2$, W/2, $β_f$) (=1/κ) of each block pattern of one shot is calculated.

⑤ A surface on which a pattern of exposure data is placed is partitioned into rectangular meshes each of A×A in size. A pattern area density $α_{i,j}$ of each mesh (i, j) is calculated.

⑥ By For each mesh (i, j), an effective pattern area density $α'_{i,j}$ is calculated using the equation (10).

⑦ For each block pattern i, a normalized, corrected exposure dose $$d_p=Qcp/Qth=(1+2\eta)/(1/\kappa+2\eta\alpha_p'(i,m)) \qquad (15)$$

is calculated, where $α_p$'(i, m) is the maximum of effective pattern area densities of all the meshes which overlap with the block pattern i, i.e. the pattern of interest.

⑧ For each block pattern i and each mesh j which overlap with this block pattern i, a normalized, auxiliary exposure dose $$d_{aux.ij}=Qaux.ij/Qcp.ij,=(\alpha p'(i,m)-\alpha p'(i,j))\eta \qquad (16)$$

is calculated, where $α_p$'(i, j) is the effective pattern area densities of the mesh j.

⑨ The meshes where $d_{aux.ij}$≠0 are determined as a region on which an auxiliary shot is actually performed. That is, an auxiliary shot is generated. As described above, $d_{aux.ij}$>Δ can be a criteria for judging of auxiliary shot generation.

In order to converge the solution, the process returns to the above step ⑥. it was found from the following experiments that three times of repetition are enough for getting good precision of pattern dimension.

The parameters of the basic exposure intensity function were $β_f$=20 μm, $β_b$=8.6 μm and η=0.65 μm. With respect to a line and space pattern of 1:1 with design line-width being 0.07 µm, the above processings ① to ⑤ were performed, and the exposure data obtained by performing the above processings ⑥ to ⑨ 0, 1 and 3 times were made. Using these exposure data, exposures were performed, and developments were performed. Thereafter, the mean and standard deviation of measured line-widths along a line which go through the middle of the pattern and go across the line pattern ware calculated, and the following result was obtained

| repetition times | mean (nm) | standard deviation (nm) |
|---|---|---|
| 0 | 70.34 | 3.00 |
| 1 | 70.05 | 0.51 |
| 3 | 69.98 | 0.21 |

With respect to another pattern having two large rectangular of 20 µm×20 µm and the above-described line and space pattern arranged therebetween, doing same as above, the following result was obtained.

| repetition times | mean (nm) | standard deviation (nm) |
|---|---|---|
| 0 | 71.67 | 20.15 |
| 1 | 73.35 | 1.49 |
| 3 | 70.88 | 1.01 |

Although over three times of repetition were performed, almost same result was obtained.

By superposing auxiliary shots on block shots with such a simple data processing, the number of shots per a unit area can be decreased compared with a case in which a block pattern is decomposed in multiple variable-shaped rectangular exposures with no reduction in dimensional accuracy of a developed pattern in a region where effective pattern area densities change rapidly.

Further, since exposure intensities of block shots and auxiliary shots are calculated using a pattern area density method, calculation is comparatively easy.

Then, description will be made of dimensional accuracy of a developed pattern measured after exposure and development using exposure data prepared according to the proximity effect correction method of the first embodiment.

Figure 20:
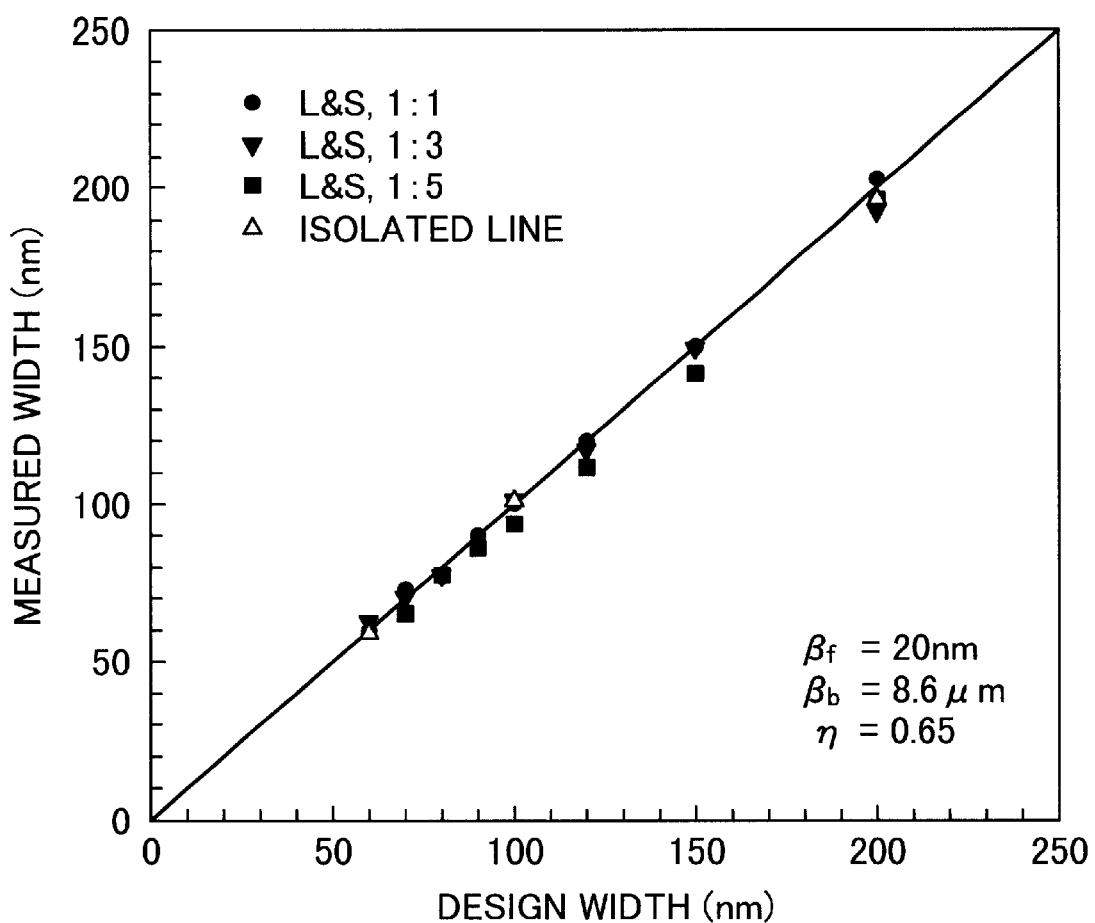
FIG. 20 is a graph showing a relation between a design width and a width measured after exposing with exposure data prepared according to the proximity effect correction method of the first embodiment and after development.

FIG. 20 is a graph showing a relation of a measured width and a design width width respect to line and space patterns of 1:1, 1:3 and 1:5 and isolated patterns. The parameters of the basic exposure intensity function were $\beta_f$=20 µm, $\beta_b$ 8.6 µm and η=0.65 µm. The mesh size was 1 µm×1 µm and the block shot size was 4 µm×4 µm.

It is found from this graph that errors of measured widths are within +/−0.01 µm for widths in the range of from 0.06 to 0.2 µm.

Figure 21:
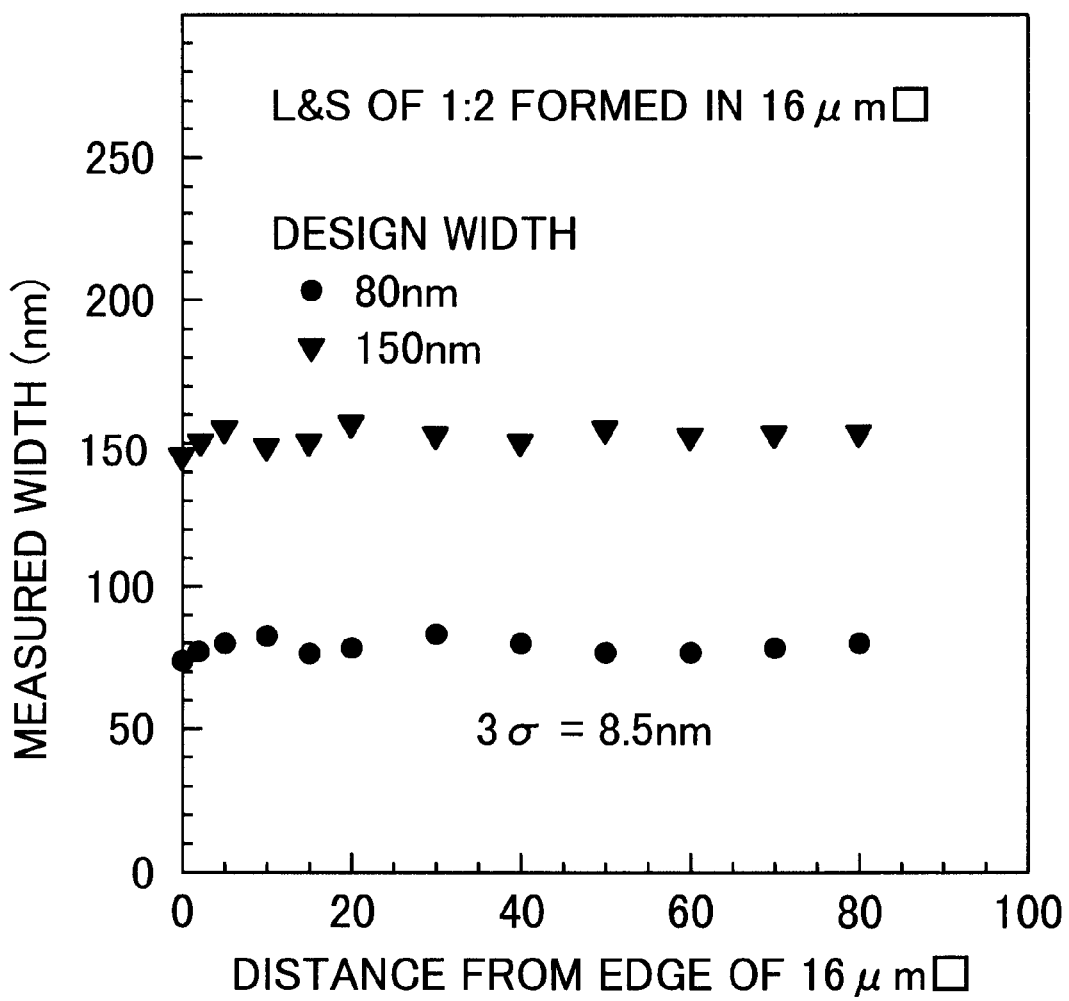
FIG. 21 is a graph showing a relation between a distance from a pattern edge and a line width measured after exposing with exposure data prepared according to the proximity effect correction method of the first embodiment and after development.

FIG. 21 is a graph showing a relation of a measured width and a distance from a pattern edge with respect to a line and space pattern of 1:2 formed in a 160 µm square. The experiments were performed for each of design line widths of 0.08 µm and 0.15 µm. The parameters of the basic exposure intensity function were $\beta_f$=20 µm, $\beta_b$ 8.6 µm and η=0.65 µm. The mesh size was 1 µm×1 µm and the block shot size was 4 µm×4 µm.

A standard deviation α was 0.0028 µm. It is found from this that accuracy of a developed pattern is sufficiently high by additionally performing auxiliary exposure for meshes in a region where effective pattern area densities change rapidly.

Second Embodiment

Next, description will be given of an electron beam exposure method using a proximity effect correction method of the second embodiment according to the present invention.

(1B) Forward Scattering Term

Figure 22:
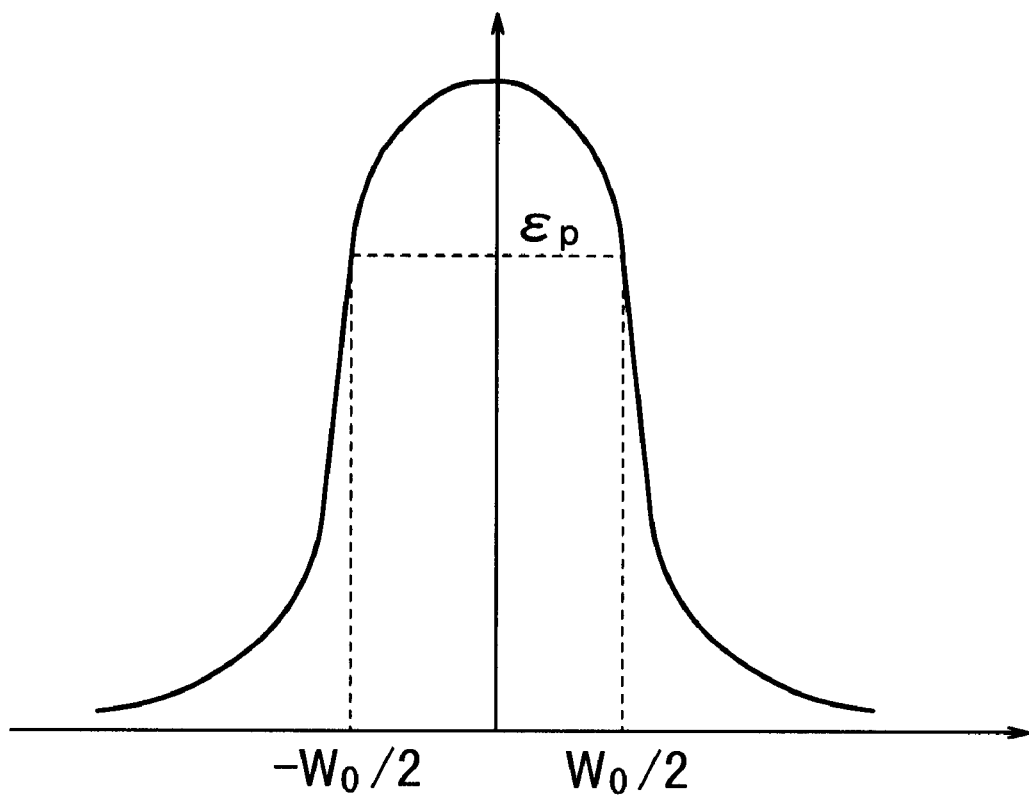
FIG. 22 is a graph illustrating a proximity effect correction method of the second embodiment according to the present invention, and showing an exposure intensity $\epsilon_p$ at which a width of an exposure, intensity distribution due to forward-scattering is equal to a design width $W_0$ without changing the design width $W_0$.

In this correction method, as shown in FIG. 22, an exposure intensity $\epsilon_p$ is determined at which a peak width of an exposure intensity distribution due to forward-scattering is equal to a design width $W_0$. That is, $\epsilon_p$ is calculated by the following equation.

$$\epsilon_p = Ef(W_0/2, W_0/2, \beta_f) \quad (17)$$

An exposure intensity $\epsilon_p$ of a reference pattern, e.g. the above-described large pattern is denoted as $\epsilon_o$.

(2B) Backscattering Term

Figure 23:
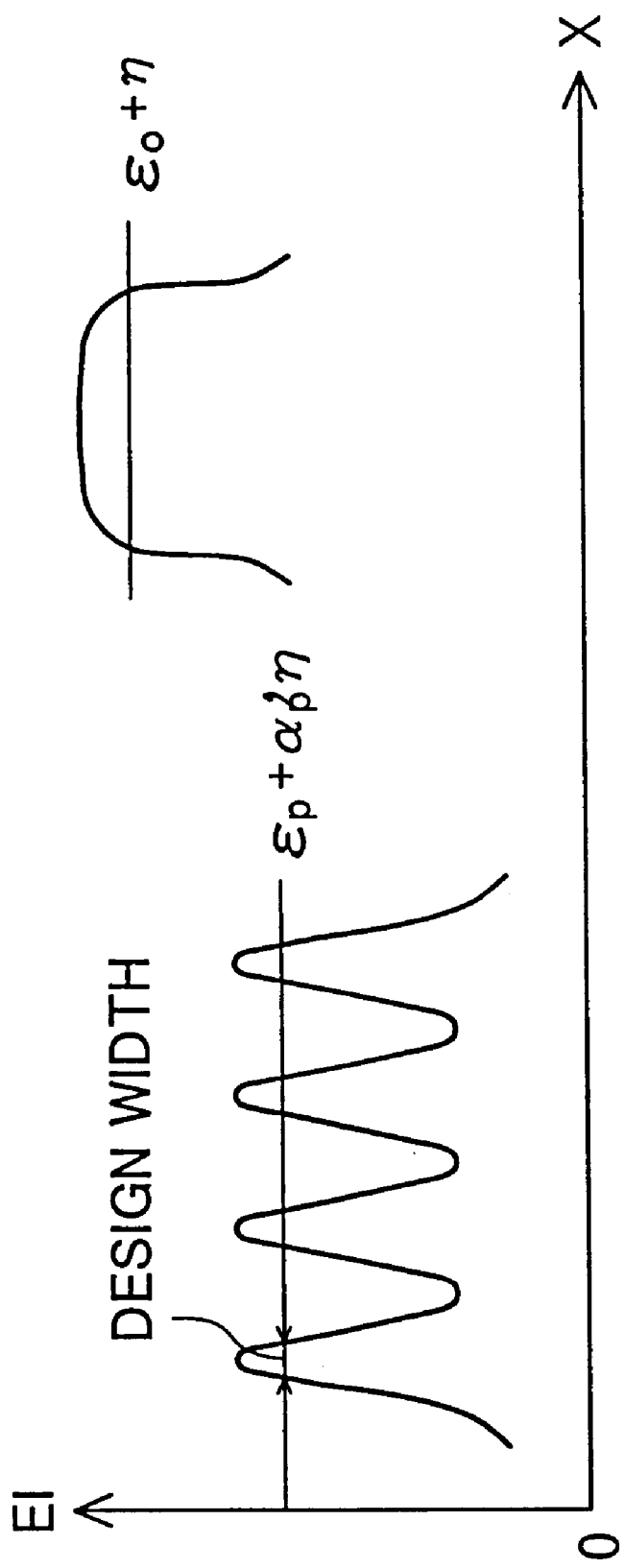
FIG. 23 is a graph showing exposure intensity distributions of a line and space pattern and the large pattern (the reference pattern) in consideration of forward-scattering and backscattering and without consideration of proximity effect correction.
Figure 24:
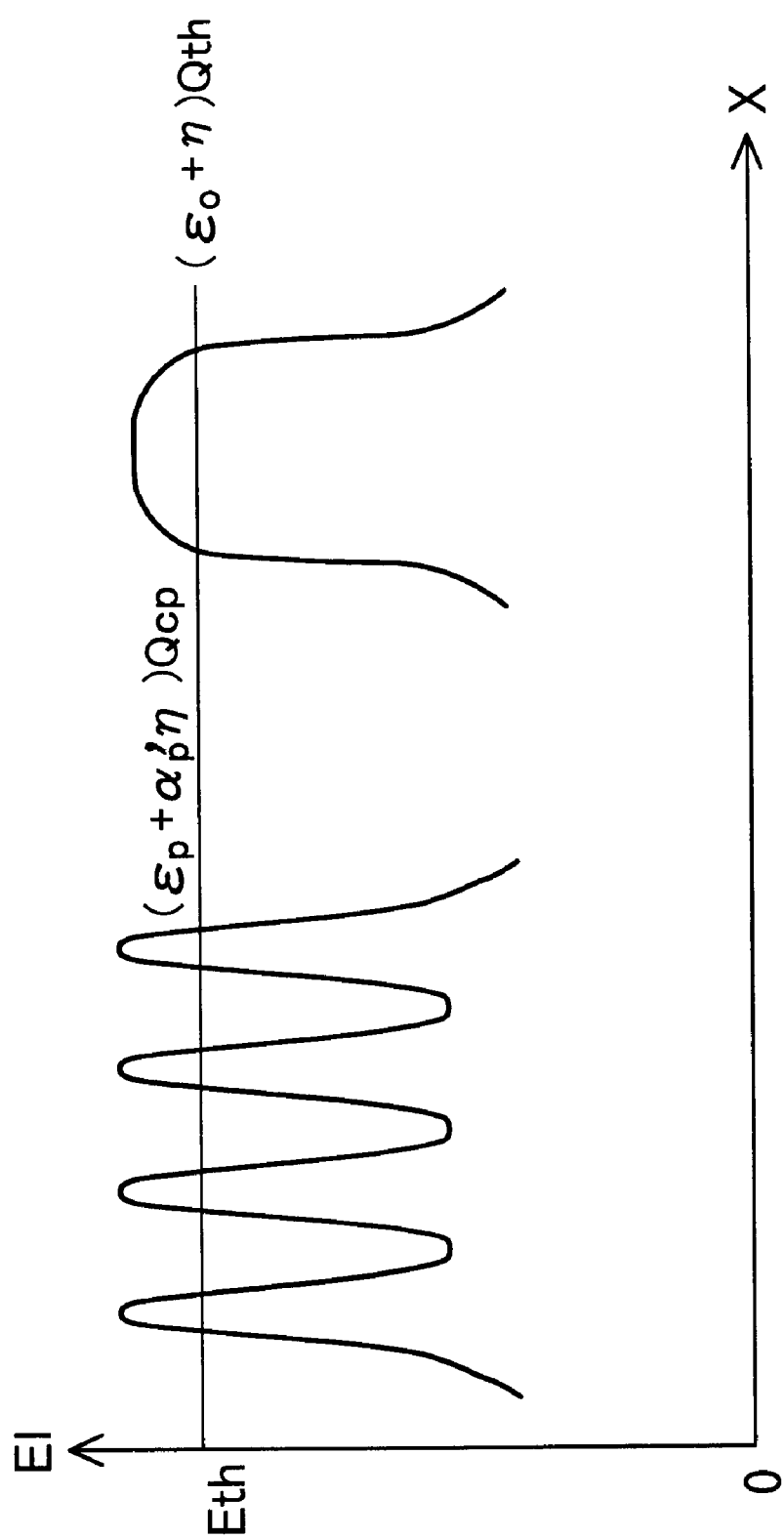
FIG. 24 is a graph showing exposure intensity distributions in additional consideration of proximity effect correction to the distributions of FIG. 23.

FIG. 23 is a graph showing exposure intensity distributions of a line and is pace pattern and the large pattern (the reference pattern) in consideration of forward-scattering and backscattering and without consideration of proximity effect correction. FIG. 24 is a graph showing exposure intensity distributions in additional consideration of proximity effect correction to the distributions of FIG. 23.

exposure dose correction taken into consideration of backscattering is performed in such a way that the intensity giving a design width of each pattern is equal to the threshold value Eth for development, that is, such that the corrected intensity $(\epsilon_p + \alpha_p' \eta)Qcp$ giving a design width is equal to the threshold Value Eth. Letting the corrected exposure dose Qcp of the reference pattern be Qth, the following equation holds.

$$(\epsilon_p + \alpha_p' \eta)Qcp = (\epsilon_o + \eta)Qth \quad (18)$$

Therefore, the corrected exposure dose Qcp is expressed by the following equation.

$$Qcp = \{(\epsilon_o + \eta)/(\epsilon_p + \alpha_p' \eta)\}Qth \quad (19)$$

With such a corrected exposure dose Qcp, since the intensity giving a design width of each pattern is equal to the threshold value Eth for development, a dimension of each pattern can be a design width with good accuracy.

The other calculations are the same as those in the first embodiment.

Although preferred embodiments of the present invention has been described, it is to be understood that the invention is not limited thereto and that various changes and modifications may be made without departing from the spirit and scope of the invention.

For example, the basic exposure intensity distribution function is not limited to double Gaussian, but instead, there can be adopted triple Gaussian with a third term including a fitting coefficient γ to increase coincidence with actual measurement and a secondary electron scattering ratio η', or alternatively a polynomial approximation.

Further, the beam blur δ is not limited to a linear equation with respect to an electron beam current Ib.

Furthermore, a range which is taken into consideration in calculation of an effective pattern area density is not limited to the above ranges, but it may be determined in a balance between a required dimensional accuracy of a developed pattern and a calculation time for correction.

There is no necessity that a side of a mesh is 1/(an integer) times that of a block pattern.

Further, a shot larger than a mesh is not limited to a block shot, but it may be a variable-shaped rectangular shot.

What is claimed is:

1. A method to perform proximity effect correction on exposure pattern data of a charge particle beam, comprising:

adjusting a design width of the exposure pattern data to a self-corrected width based on a forward-scattering intensity until a peak width, which is a width of an exposure intensity distribution at a height of a predetermined percent of a peak value of the exposure intensity distribution, is equal to the design width in both X and Y directions, respectively;

correcting an exposure dosed based on a backscattering intensity of the exposure intensity distribution and a smoothed pattern area density;

determining an auxiliary exposure dose and generating an auxiliary exposure shot; and repeating correcting the exposure dose, determining the auxiliary exposure dose and generating the auxiliary exposure shot until pattern dimensions converge within a predetermined precision.

2. The method according to claim 1, wherein said peak width is equal to a half-width of the exposure intensity distribution.

3. The method according to claim 1, wherein said correcting an exposure dose comprises:

partitioning a placement surface of an exposure pattern into meshes;

determining a pattern area density of each mesh;

determining an effective pattern area density by smoothing said pattern area densities; and determining said exposure intensity distribution due to said backscattering intensity as a value proportional to said effective pattern area density.

4. The method according to claim 3, wherein said correcting an exposure dose comprises:

determining a corrected exposure dose Qcp as $$Qcp=\{(1+2\eta)/(1/\kappa+2\alpha_p\eta)\}Qth$$

where $\eta$ is a backscattering ratio, $\alpha_p$ is said effective pattern area density, $1/\kappa$ is said peak value due to said forward-scattering term and Qth is equal to said corrected exposure dose Qcp on a reference pattern having $\alpha_p=1$.

5. A charged particle beam exposure method to perform proximity effect correction on exposure pattern data, comprising:

determining an exposure intensity at which a design width of the exposure pattern data to a self-corrected width based on a forward-scattering intensity until a peak width, which is a width of an exposure intensity distribution at a height of a predetermined percent of a peak value of the exposure intensity distribution, is equal to the design width in both X and Y directions, respectively; and correcting an exposure dose based on a backscattering intensity of the exposure intensity distribution and a smoothed pattern area density.

6. The method according to claim 5, wherein said correcting an exposure dose comprises:

determining a corrected exposure dose Qcp as $$Qcp=\{(\epsilon_o+\eta)/(\epsilon_p+\alpha_p\eta)\}Qth$$

where $\eta$ is a backscattering ratio, $\alpha_p$ is said effective pattern area density, $\epsilon_o$ is equal to an exposure intensity $\epsilon_p$ of a reference pattern having $\alpha_p=1$ and Qth is equal to said corrected exposure dose Qcp of said reference pattern.

7. The method according to claim 5, wherein said correcting an exposure dose comprises:

partitioning a placement surface of an exposure pattern into meshes;

determining a pattern area density of each mesh;

determining an effective pattern area density by smoothing said pattern area densities; and determining said exposure intensity due to said backscattering intensity as a value proportional to said effective pattern area density.

8. A method to perform proximity effect correction of charged particle beam exposure pattern data, comprising:

partitioning a placement surface of the exposure pattern into meshes each smaller in area than a maximum size of one shot for pattern exposure;

determining a pattern area density of each mesh;

determining an effective pattern area density by smoothing said pattern area densities;

determining an exposure intensity due to a backscattering term of a basic exposure intensity distribution function as a value proportional to said effective pattern area density; and performing auxiliary exposure on meshes each short of an exposure dose with one shot for a pattern.

9. The method according to claim 8, wherein said maximum size of one shot for pattern exposure is equal to a size of one shot exposure for a block pattern on a stencil mask.

10. The method according to claim 9, wherein each of said meshes is equal to a size of a rectangular beam for one shot exposure.

11. The method according to claim 8, wherein an exposure dose of one shot for pattern exposure of interest is determined based on a maximum of effective pattern area densities of a plurality of meshes superimposed on said one shot.

12. The method according to claim 11, wherein an auxiliary exposure dose Qaux.i for a mesh of interest in one shot area for pattern exposure is determined as a value proportional to ($\alpha'm-\alpha'i$), where $\alpha'i$ is an effective pattern area density of said mesh of interest and $\alpha'm$ is a maximum of effective pattern area densities of meshes in said one shot area.

13. The method according to claim 11, wherein an auxiliary exposure dose Qaux.i for a mesh of interest in one shot area for pattern exposure is determined as $$Qaux.i=(\alpha'm-\alpha'i)\eta Qcp$$

where $\eta$ is a backscattering ratio, $\alpha'i$ is an effective pattern area density of said mesh of interest, $\alpha'm$ is a maximum of effective pattern area densities of meshes in said one shot area and Qcp is an exposure dose of said one shot.

14. The method according to claim 13, wherein said exposure dose Qcp of said one shot is determined as $$Qcp=\{(1+2\eta)/(1/\kappa+2\alpha'm\eta)\}Qth$$

where $1/\kappa$ is a peak value of an exposure intensity distribution after changing a design width in such a way that a peak width of said exposure intensity distribution at a height of a predetermined percent of said peak value thereof is said design width, said distribution being obtained by calculating an integral of a forward-scattering term of a basic exposure intensity distribution function over a pattern of interest and Qth is equal to an exposure dose Qcp for a reference pattern having αm'=1.

15. The method according to claim 13, wherein said exposure dose Qcp of said one shot is determined as $$Qcp=\{(\epsilon_o+\eta)/(\epsilon_p+\alpha'm\eta)\}Qth$$

where $\epsilon_p$ is an exposure intensity at which a design width is equal to a peak width of an exposure intensity distribution obtained by calculating an integral of a forward-scattering term of a basic exposure intensity distribution function over a pattern of interest to be exposed, $\epsilon_o$ is equal to said exposure intensity $\epsilon_p$ of a reference pattern having α'm=1 and Qth is equal to an exposure dose Qcp for a reference pattern having αm'=1.

16. The method according to claim 15, wherein said predetermined percent is a value in a range of 30% to 70%.

17. A charged particle beam exposure method to perform proximity effect correction on exposure pattern data, comprising:

self-correcting a width of the exposure pattern data by:
    determining an exposure intensity distribution of the exposure pattern data based on a forward-scattering intensity;
    checking whether a peak width of the exposure intensity distribution, at a predetermined percentage of a peak value of the exposure intensity distribution, equals a design width;
    dimensionally shifting, when the peak width of the exposure intensity distribution is greater than the design width, the exposure pattern data to a self-corrected pattern; and
    repeating the operations of self-correcting until, in an X and a Y direction, the peak width of the exposure intensity distribution at a predetermined percent of the peak value of the exposure intensity distribution is equal to the design width;

correcting an exposure dose by:
    determining a forward scattering intensity at the predetermined percent of the peak value of the exposure intensity distribution;
    determining a pattern area density;
    smoothing the pattern area density;
    determining a corrected exposure dose;

generating an auxiliary exposure by:
    determining an auxiliary exposure dose;
    generating an auxiliary shot; and returning to the operation of smoothing the pattern area density and repeating operations until corrected exposure data provide pattern dimensions that converge within a predetermined precision.

* * * * *